(12) United States Patent
Paussa et al.

(10) Patent No.: US 10,790,842 B1
(45) Date of Patent: Sep. 29, 2020

(54) SYSTEM AND METHOD FOR A SUCCESSIVE APPROXIMATION ANALOG-TO-DIGITAL CONVERTER

(71) Applicant: Infineon Technologies AG, Neubiberg (DE)

(72) Inventors: Alan Paussa, Villach (AT); Francesco Conzatti, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/670,559

(22) Filed: Oct. 31, 2019

(51) Int. Cl.
*H03M 1/06* (2006.01)

(52) U.S. Cl.
CPC .................. *H03M 1/0675* (2013.01)

(58) Field of Classification Search
CPC ......... H03M 1/0675; H03M 1/12; H03M 1/00
USPC .......................................... 341/118, 161, 155
See application file for complete search history.

(56) References Cited

U.S. PATENT DOCUMENTS

| | | | |
|---|---|---|---|
| 7,173,557 B2 | 2/2007 | Kuttner | |
| 7,286,075 B2 | 10/2007 | Hennessy et al. | |
| 7,315,269 B2* | 1/2008 | Schreier | H03M 3/324 |
| | | | 341/143 |
| 7,342,530 B2 | 3/2008 | Kuttner | |
| 7,528,761 B2 | 5/2009 | Draxelmayr | |
| 7,663,518 B2 | 2/2010 | Hurrell | |
| 7,764,215 B2* | 7/2010 | Wan | H03M 1/0607 |
| | | | 341/155 |
| 8,378,863 B2* | 2/2013 | Ishikawa | H03M 1/00 |
| | | | 341/118 |
| 8,519,874 B2* | 8/2013 | Aruga | H03M 1/1019 |
| | | | 341/120 |
| 8,754,800 B2* | 6/2014 | Cowley | H03M 1/12 |
| | | | 341/172 |
| 9,154,152 B1* | 10/2015 | Chiu | H03M 1/468 |
| 9,673,835 B1* | 6/2017 | Kinyua | H03M 1/145 |
| 9,912,341 B2 | 3/2018 | Draxelmayr | |

(Continued)

OTHER PUBLICATIONS

Andrews, Blaise, presented by Karakiewicz, Raf "Dynamic Element Matching (DEM)", RAF Corp., Dec. 4, 2003, 17 pages.

(Continued)

*Primary Examiner* — Jean B Jeanglaude
(74) *Attorney, Agent, or Firm* — Slater Matsil, LLP

(57) ABSTRACT

A method of operating a redundant successive approximation analog-to-digital converter (ADC) includes: sampling an input signal; and successively approximating the sampled input signal using a digital-to-analog converter (DAC) including DAC reference elements having at least one sub-binary weighted DAC reference element. Successively approximating the sampled input signal includes performing a plurality of successive approximation cycles. Each successive approximation cycle of the plurality of successive approximation cycles including: generating a DAC input word using a successive approximation register (SAR), offsetting the DAC input word to form an offset DAC input word when the successive approximation cycle corresponds to the at least one sub-binary weighted reference element, applying the offset DAC input word to an input of the DAC to produce a first DAC output signal, comparing the first DAC output signal with the sampled input signal using a comparator, and setting a bit of the SAR based on the comparison.

20 Claims, 14 Drawing Sheets

(56) References Cited

U.S. PATENT DOCUMENTS

| | | | | |
|---|---|---|---|---|
| 9,960,778 | B2* | 5/2018 | Kimura | H03M 1/468 |
| 10,404,264 | B2* | 9/2019 | Chen | H03M 1/462 |
| 2013/0106630 | A1* | 5/2013 | Wong | H03M 1/46 341/110 |
| 2015/0061904 | A1* | 3/2015 | Lee | H03M 1/1023 341/118 |
| 2016/0134300 | A1* | 5/2016 | Wang | H03M 1/1245 341/172 |
| 2017/0250699 | A1* | 8/2017 | Fuchs | H03M 1/468 |

OTHER PUBLICATIONS

Chan, Kok Lim et al., "Segmented Dynamic Element Matching for High-Resolution Digital-to-Analog Conversion", IEEE Transactions on Circuits and Systems—I: Regular Papers, vol. 55, No. 11, Dec. 2008, pp. 3383-3392.

Chang, Albert H., et al., "A 12b 50MS/s 2.1MW SAR ADC with redundancy and digital background calibration", MIT Open Access Articles, IEEE Proceedings of the ESSCIRC, Sep. 2013, 5 pages.

Chang, Albert Hsu Ting et al., "Low-Power High-Performance SAR ADC with Redundancy and Digital Background Calibration", Massachusetts Institute of Technology, Jun. 2013, 199 pages.

Ghittori, Nicola et al., "Analysis of the Ideal SFDR Limit for an N Bit Digital-to-Analog Converter", 12th IEEE International Conference on Electronics, Circuits and Systems, Dec. 11, 14, 2005, 4 pages.

Kuttner Franz "A 1.2V 10b 20MSample/s Non-Binary Successive Approximation ADC in 0.13um CMOS", ISSCC, Session 10, High-Speed ADCs, 10.6, Infineon Technologies AG, Jan. 2002, 2 pages.

Lee, Chun C., et al., "A 66dB SNDR 15MHz BW SAR Assisted ΔΣ ADC in 22nm Tri-gate CMOS", IEEE Symposium on VLSI Circuits Digest of Technical Papers, Jun. 12-14, 2013, 2 pages.

Liu, Wenbo et al., "A 12b 22.5/45MS/s 3.0mW 0.059mm2 CMOS SAR ADC Achieving Over 90dB SFDR", IEEE International Solid-State Circuits Conference, ISSCC, Session 21, Successive-Approximation ADCs /21.2, Feb. 2010, 3 pages.

Maxim integrated "Understanding SAR ADCs: Their Architecture and Comparison with Other ADCs", Tutorial 1080, Maxim > Design Support > Technical Documents > Tutorials > A/D and D/A Conversion/Sampling Circuits > APP 1080, Oct. 2, 2001, 7 pages.

https://en.wikipedia.org/wiki/Log-normal_distribution.

Wu, Bo et al., "A 24.7mW 45MHz-BW 75.3dB-SNDR SAR-Assisted CT ΔΣ Modulator with 2nd-Order Noise Coupling in 65nm CMOS", IEEE International Solid-State Circuits Conference, ISSCC, Session 15, Oversampling Data Converters, 15.1, Feb. 2, 2016, 3 pages.

\* cited by examiner

| redundant bit | Weight in unit caps | Normalized weight |
|---|---|---|
| 12 | 111 | 1776 |
| 11 | 64 | 1024 |
| 10 | 36 | 576 |
| 9 | 20 | 320 |
| 8 | 11 | 176 |
| 7 | 6 | 96 |
| 6 | 4 | 64 |
| 5 | 2 | 32 |
| 4 | 1 | 16 |
| 3 | 0.5 | 8 |
| 2 | 0.25 | 4 |
| 1 | 0.125 | 2 |
| 0 | 0.0625 | 1 |
| total number of levels | 4096 => 12 effective bits | |

*Fig. 3B*

| Cycle | SARP<12:0> (MSB->LSB) | | | | | | | | | | | | |
|---|---|---|---|---|---|---|---|---|---|---|---|---|---|
| 0 (Initial) | 0 | 0 | 0 | 0 | 0 | 0 | 0 | 0 | 0 | 0 | 0 | 0 | 0 |
| 1 | C[12] | 0 | 0 | 0 | 0 | 0 | 0 | 0 | 0 | 0 | 0 | 0 | 0 |
| 2 | C[12] | C[11] | 0 | 0 | 0 | 0 | 0 | 0 | 0 | 0 | 0 | 0 | 0 |
| 3 | C[12] | C[11] | C[10] | 0 | 0 | 0 | 0 | 0 | 0 | 0 | 0 | 0 | 0 |
| 4 | C[12] | C[11] | C[10] | C[9] | 0 | 0 | 0 | 0 | 0 | 0 | 0 | 0 | 0 |
| 5 | C[12] | C[11] | C[10] | C[9] | C[8] | 0 | 0 | 0 | 0 | 0 | 0 | 0 | 0 |
| 6 | C[12] | C[11] | C[10] | C[9] | C[8] | C[7] | 0 | 0 | 0 | 0 | 0 | 0 | 0 |
| 7 | C[12] | C[11] | C[10] | C[9] | C[8] | C[7] | C[6] | 0 | 0 | 0 | 0 | 0 | 0 |
| 8 | C[12] | C[11] | C[10] | C[9] | C[8] | C[7] | C[6] | C[5] | 0 | 0 | 0 | 0 | 0 |
| 9 | C[12] | C[11] | C[10] | C[9] | C[8] | C[7] | C[6] | C[5] | C[4] | 0 | 0 | 0 | 0 |
| 10 | C[12] | C[11] | C[10] | C[9] | C[8] | C[7] | C[6] | C[5] | C[4] | C[3] | 0 | 0 | 0 |
| 11 | C[12] | C[11] | C[10] | C[9] | C[8] | C[7] | C[6] | C[5] | C[4] | C[3] | C[2] | 0 | 0 |
| 12 | C[12] | C[11] | C[10] | C[9] | C[8] | C[7] | C[6] | C[5] | C[4] | C[3] | C[3] | C[1] | 0 |
| 13 (Final) | C[12] | C[11] | C[10] | C[9] | C[8] | C[7] | C[6] | C[5] | C[4] | C[3] | C[3] | C[1] | C[0] |

*Fig. 3C*

| Cycle | SARN<12:0> (MSB->LSB) | | | | | | | | | | | | |
|---|---|---|---|---|---|---|---|---|---|---|---|---|---|
| 0 (Initial) | 0 | 0 | 0 | 0 | 0 | 0 | 0 | 0 | 0 | 0 | 0 | 0 | 0 |
| 1 | !C[12] | 0 | 0 | 0 | 0 | 0 | 0 | 0 | 0 | 0 | 0 | 0 | 0 |
| 2 | !C[12] | !C[11] | 0 | 0 | 0 | 0 | 0 | 0 | 0 | 0 | 0 | 0 | 0 |
| 3 | !C[12] | !C[11] | !C[10] | 0 | 0 | 0 | 0 | 0 | 0 | 0 | 0 | 0 | 0 |
| 4 | !C[12] | !C[11] | !C[10] | !C[9] | 0 | 0 | 0 | 0 | 0 | 0 | 0 | 0 | 0 |
| 5 | !C[12] | !C[11] | !C[10] | !C[9] | !C[8] | 0 | 0 | 0 | 0 | 0 | 0 | 0 | 0 |
| 6 | !C[12] | !C[11] | !C[10] | !C[9] | !C[8] | !C[7] | 0 | 0 | 0 | 0 | 0 | 0 | 0 |
| 7 | !C[12] | !C[11] | !C[10] | !C[9] | !C[8] | !C[7] | !C[6] | 0 | 0 | 0 | 0 | 0 | 0 |
| 8 | !C[12] | !C[11] | !C[10] | !C[9] | !C[8] | !C[7] | !C[6] | !C[5] | 0 | 0 | 0 | 0 | 0 |
| 9 | !C[12] | !C[11] | !C[10] | !C[9] | !C[8] | !C[7] | !C[6] | !C[5] | !C[4] | 0 | 0 | 0 | 0 |
| 10 | !C[12] | !C[11] | !C[10] | !C[9] | !C[8] | !C[7] | !C[6] | !C[5] | !C[4] | !C[3] | 0 | 0 | 0 |
| 11 | !C[12] | !C[11] | !C[10] | !C[9] | !C[8] | !C[7] | !C[6] | !C[5] | !C[4] | !C[3] | !C[2] | 0 | 0 |
| 12 | !C[12] | !C[11] | !C[10] | !C[9] | !C[8] | !C[7] | !C[6] | !C[5] | !C[4] | !C[3] | !C[2] | !C[1] | 0 |
| 13 (Final) | !C[12] | !C[11] | !C[10] | !C[9] | !C[8] | !C[7] | !C[6] | !C[5] | !C[4] | !C[3] | !C[2] | !C[1] | !C[0] |

*Fig. 3D*

Offset induced on SAR<11>

| Cycle | SAR_OFFSET_pp<12:0> (MSB->LSB) | | | | | | | | | | | | |
|---|---|---|---|---|---|---|---|---|---|---|---|---|---|
| 1 | 0 | 0 | 0 | 0 | 0 | 0 | 0 | 0 | 0 | 0 | 0 | 0 | 0 |
| 2 | C[12] | 0 | 0 | 0 | 0 | 0 | 0 | 0 | 0 | 0 | 1 | 1 | 0 |
| 3 | C[12] | C[11] | 0 | 0 | 0 | 0 | 0 | 0 | 0 | 0 | 0 | 0 | 0 |
| 4 | C[12] | C[11] | C[10] | 0 | 0 | 0 | 0 | 0 | 0 | 0 | 0 | 0 | 0 |
| 5 | C[12] | C[11] | C[10] | C[9] | 0 | 0 | 0 | 0 | 0 | 0 | 0 | 0 | 0 |
| 6 | C[12] | C[11] | C[10] | C[9] | C[8] | 0 | 0 | 0 | 0 | 0 | 0 | 0 | 0 |
| 7 | C[12] | C[11] | C[10] | C[9] | C[8] | C[7] | 0 | 0 | 0 | 0 | 0 | 0 | 0 |
| 8 | C[12] | C[11] | C[10] | C[9] | C[8] | C[7] | C[6] | 0 | 0 | 0 | 0 | 0 | 0 |
| 9 | C[12] | C[11] | C[10] | C[9] | C[8] | C[7] | C[6] | C[5] | 0 | 0 | 0 | 0 | 0 |
| 10 | C[12] | C[11] | C[10] | C[9] | C[8] | C[7] | C[6] | C[5] | C[4] | 0 | 0 | 0 | 0 |
| 11 | C[12] | C[11] | C[10] | C[9] | C[8] | C[7] | C[6] | C[5] | C[4] | C[3] | 0 | 0 | 0 |
| 12 | C[12] | C[11] | C[10] | C[9] | C[8] | C[7] | C[6] | C[5] | C[4] | C[3] | C[2] | 0 | 0 |
| 13 | C[12] | C[11] | C[10] | C[9] | C[8] | C[7] | C[6] | C[5] | C[4] | C[3] | C[3] | C[1] | 0 |

*Fig. 3E*

| redundant bit | Weight in unit caps | Normalized weight |
|---|---|---|
| 13 | 83 | 1328 |
| 12 | 57 | 912 |
| 11 | 41 | 656 |
| 10 | 29 | 464 |
| 9 | 19 | 304 |
| 8 | 12 | 192 |
| 7 | 7 | 112 |
| 6 | 4 | 64 |
| 5 | 2 | 32 |
| 4 | 1 | 16 |
| 3 | 0.5 | 8 |
| 2 | 0.25 | 4 |
| 1 | 0.125 | 2 |
| 0 | 0.0625 | 1 |
| | total number of levels | 4096 => 12 effective bits |

*Fig. 3G*

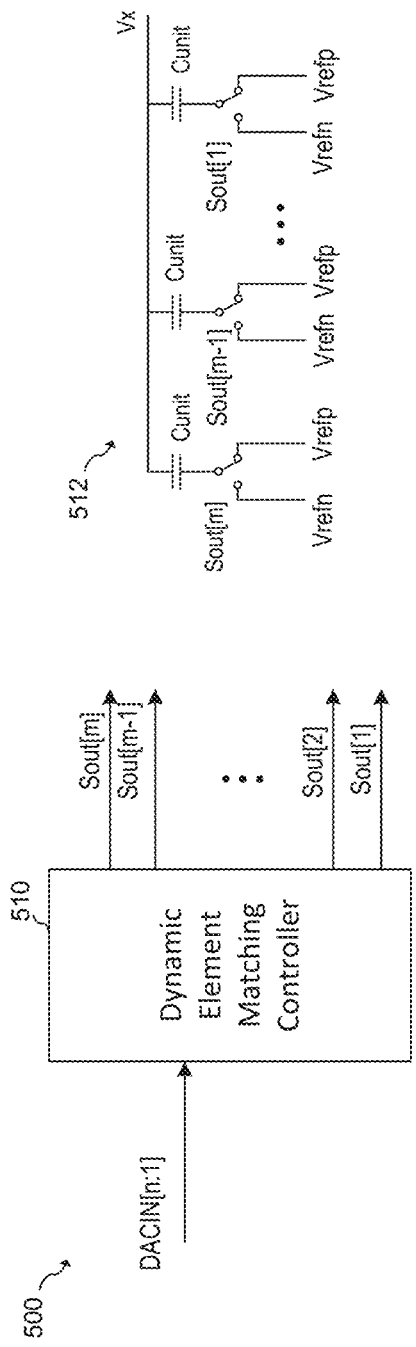
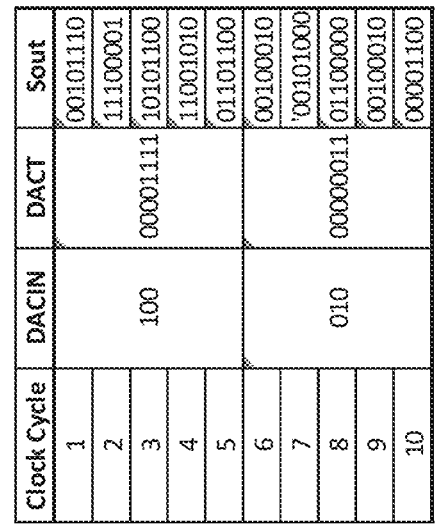
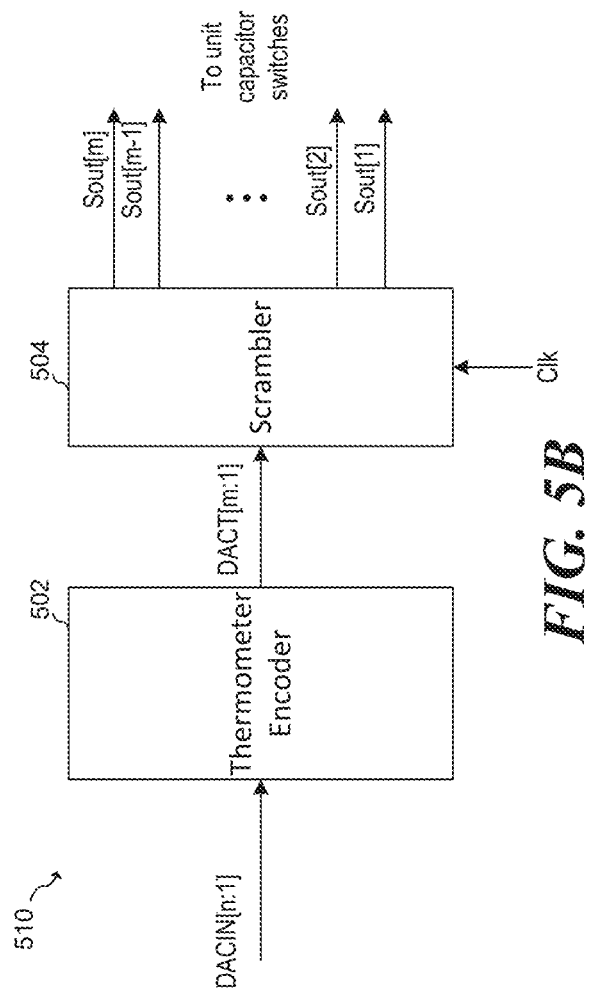
FIG. 5A
FIG. 5B
FIG. 5C

United States Patent 10,790,842 B1

SYSTEM AND METHOD FOR A SUCCESSIVE APPROXIMATION ANALOG-TO-DIGITAL CONVERTER

TECHNICAL FIELD

The present invention relates generally to a system and method for a successive approximation analog-to-digital converter (ADC).

BACKGROUND

Successive approximation ADCs convert an analog input to a digital output word by estimating the value of the analog signal using a digital-to-analog converter (DAC). Over the course of a number of successive approximation cycles, a series of digital estimates are provided to the input of the DAC. During each successive approximation cycle, the output of the DAC is compared to the analog input signal, and the result of each comparison is used to provide a closer estimate for the next estimation or successive approximation cycle. In many successive approximation ADCs, a binary search algorithm is used to perform the analog-to-digital conversion, such that each bit of the ADC output word corresponds to a particular estimation or successive approximation cycle.

Due to its relative low power consumption and simple architecture, successive approximation ADCs are increasingly used in many electronic systems for a variety of different purposes. They may be used, for example, to measure DC voltages and currents in power supply applications, to digitize microphone signals in audio applications, or to digitize downconverted RF signals in RF communication and radar systems.

Successive approximation ADCs, however, may be prone to non-linearities due to mismatch in the reference elements used to construct the DAC used to estimate the input voltage. For example, device mismatch in the capacitor array of a charge redistribution DAC or current sources of a current DAC may cause the ADC transfer function to deviate from a linear characteristic, and may manifest itself as differential non-linearity (DNL) or integral non-linearity (INL). In systems that utilize successive approximation ADCs to convert AC signals, such as radar or audio signals, the non-linearities of the ADC may cause unwanted spurious tones.

SUMMARY

In accordance with an embodiment, a method of operating a redundant successive approximation analog-to-digital converter (ADC) includes: sampling an input signal; and successively approximating the sampled input signal using a digital-to-analog converter (DAC) including DAC reference elements having at least one sub-binary weighted DAC reference element. Successively approximating the sampled input signal includes performing a plurality of successive approximation cycles. Each successive approximation cycle of the plurality of successive approximation cycles including: generating a DAC input word using a successive approximation register (SAR), offsetting the DAC input word to form an offset DAC input word when the successive approximation cycle corresponds to the at least one sub-binary weighted reference element, applying the offset DAC input word to an input of the DAC to produce a first DAC output signal, comparing the first DAC output signal with the sampled input signal using a comparator, and setting a bit of the SAR based on the comparison.

In accordance with another embodiment, an analog-to-digital converter (ADC) includes: a digital-to-analog converter (DAC) including redundant codes; a comparator coupled to an output of the DAC; a successive approximation register (SAR) coupled to an output of the comparator; and a code adjustment circuit coupled between the SAR and an input of the DAC, the code adjustment circuit configured to offset an input code to the DAC during at least one successive approximation cycle.

In accordance with a further embodiment, an analog-to-digital converter (ADC) includes: a charge redistribution digital-to-analog converter (DAC) including a plurality of capacitors having a common node, where at least one of the plurality of capacitors includes a sub-binary weight, and a plurality of DAC input codes map to a same output space within a redundancy region associated with the at least one of the plurality of capacitors including the sub-binary weight; a comparator coupled to the common node of the charge redistribution DAC; a successive approximation register (SAR) coupled to an output of the comparator; an offset circuit coupled between an output of the SAR and an input of the DAC, the offset circuit configured to offset an input code to the DAC during at least one successive approximation cycle associated with the at least one of the plurality of capacitors including the sub-binary weight; and an output code mapping circuit coupled between the output of the SAR and an output of the ADC, the output code mapping circuit configured to convert an output of the SAR to a binary weighted output value.

BRIEF DESCRIPTION OF THE DRAWINGS

For a more complete understanding of the present invention, and the advantages thereof, reference is now made to the following descriptions taken in conjunction with the accompanying drawings, in which:

FIG. 3B illustrates a DAC weighing table; FIGS. 3C, 3D and 3E show tables illustrating the logical operation of the successive approximation ADC of FIG. 3A; FIG. 3F illustrates a schematic of an embodiment offset logic circuit; FIG. 3G illustrates a DAC weighing table according to an alternative embodiment.

FIGS. 5A and 5B illustrate schematics of charge redistribution DAC 500 utilizes dynamic element matching; and FIG. 5C is a table illustrating the operation of dynamic element matching controller of FIGS. 5A and 5B;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a successive approximation ADC in the context of a radar system. The invention may also be applied to the use of successive approximation ADCs in other types of systems, such as audio systems, RF communication systems, and other electronic systems that utilize ADCs.

In accordance with an embodiment, a redundant successive approximation based ADC is disclosed in which the effect of non-linearities due to mismatch of DAC reference elements is reduced by modifying the output code sequence of a redundant DAC such that the number of bit transitions between sequential output DAC codes is reduced for certain codes. The output code sequence is modified by adding an offset to the DAC input word during at least one successive approximation cycle. In some embodiments, this added offset modifies the trajectories of the successive approximation in a manner that avoids one or more major-carry transitions of the DAC in which mismatch-induced non-linearities are most pronounced.

Advantageously, some embodiments of the present invention may be less sensitive to random mismatch of DAC reference elements, and may exhibit a higher yield with respect to linearity performance and/or with respect to spurious-free dynamic range (SFDR). In some embodiments, SFDR performance may be met without the need for linearity calibration and/or dithering. Besides that, embodiments may also be advantageously combined with other known linearity improvement systems and methods including, but not limited to linearity calibration and dynamic element matching.

Figure 1A:
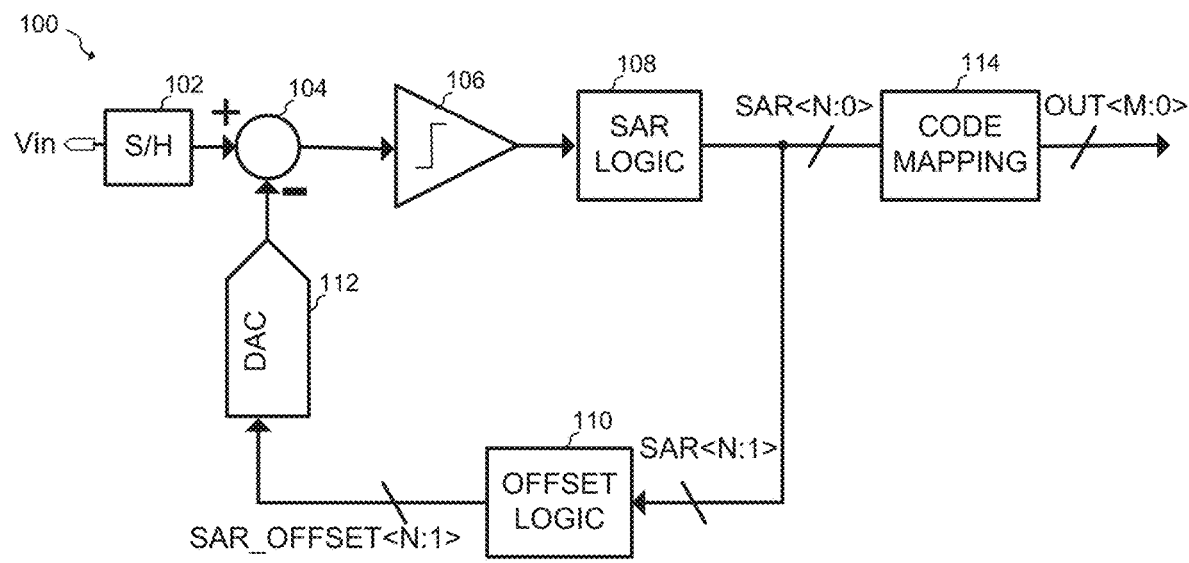
FIG. 1A is a block diagram of an embodiment successive approximation ADC.

Turning to FIG. 1A, a successive approximation ADC 100 according to an embodiment of the present invention is shown. ADC 100 includes a sample and hold circuit 102, a summing circuit 104, comparator 106, successive approximation logic 108 (also referred to as a "successive approximation register (SAR)"), a code mapping circuit 114, offset logic 110, and a sub-binary DAC 112.

During operation, sample and hold circuit 102 samples input voltage Vin to form a sampled input signal. Next, in a series of successive approximation cycles, successive approximation logic 108 working in conjunction with sub-binary DAC 112, successively approximates input voltage Vin. During at least one successive approximation cycle, offset logic 110 (also referred to as a "code adjustment circuit") introduces an offset in SAR output word SAR<N:0>. As explained herein, in some embodiments, this offset modifies the successive approximation trajectory for some input signals Vin, thereby creating an output code mapping that reduces the number of bit inversions in output word SAR<N:0> in one or more pairs of adjacent output words. When each conversion is complete, code mapping circuit 114 converts the sub-binary represented output SAR<N:0> to a binary code (also referred to as a "binary weighted output value"), as is also explained further herein.

In various embodiments, in a first successive approximation cycle, successive approximation logic 108 sets SAR<N:0> to a predetermined state. In some embodiments, setting SAR<N:0> may entail setting all of the bit of SAR<N:0> to zero. Alternatively, the most significant bit SAR<N> of SAR<N:0> may be set to a first state (e.g., one), and the remaining bits of SAR<N:0> may be set to a second state different from the first state (e.g., zero). In further embodiments, the initial state of SAR<N:0> may be different from these examples depending on the particular embodiment and its specifications. Summing circuit 104 subtracts the output of DAC 112 from the output of sample and hold circuit 102 and passes the resultant error to comparator 106. The output of comparator 106 is indicative of whether the first estimate provided by DAC 112 is less than or greater than the sample voltage produced by sample and hold circuit 102.

In one embodiment, for example an embodiment in which all bits of SAR<N:0> are initially set to zero, if the output of comparator 106 indicates that the output of DAC 112 overestimated the sample voltage, successive approximation logic 108 keeps the most significant bit SAR<N> to zero, and keeps the remaining bits SAR<N−1:0> at zero. If, on the other hand, the output of comparator 106 indicates that the output of DAC 112 underestimated the sampled voltage, successive approximation logic 108 sets the most significant bit SAR <N> to one and keeps the remaining bits SAR<N−1:0> at zero. Operation of ADC 100 proceeds bit by bit on a similar basis until the sampled input voltage is more closely estimated by the output of DAC 112.

In other embodiments, operation of successive approximation logic 108 may proceed in a different manner. For example, an embodiment in which the most significant bit SAR<N> is set to one and the remaining bits SAR<N−1:0> are initially set to zero, if the output of comparator 106 indicates that the output of DAC 112 overestimated the sample voltage, successive approximation logic 108 sets the most significant bit SAR<N> to zero, sets the next most significant bit SAR<N−1> to one, and then sets the remaining bits SAR <N−2:0> to zero. If, on the other hand, the output of comparator 106 indicates that the output of DAC 112 underestimated the samples voltage, successive approximation logic 108 sets the most significant bit SAR <N> to one, sets the next most significant bit SAR<N−1> to one, and then sets the remaining bits SAR <N−2:0> to zero. Operation of ADC 100 proceeds bit by bit on a similar basis until the sampled input voltage is more closely estimated by the output of DAC 112.

It should be appreciated that the aforementioned successive approximation methods are just a small number of examples of many possible successive approximation methods that could be applied to embodiments of the present invention. In alternative embodiments, other successive approximation methods that successively approximate the sampled input voltage in a closed loop manner could be used.

During operation, a number of non-idealities may affect the performance of ADC 100. For example, when the most significant bit SAR<N> is being evaluated, settling time errors, offset errors and noise within summing circuit 104 and comparator 106 may create a situation in which the successive approximation cycles produces an incorrect estimate. Such an incorrect estimate may result in nonlinearities with respect to the relationship between input voltage Vin and the output code out <M:0>.

One way in which errors resulting from long setting times, offsets and noise may be addressed is by using a successive approximation ADC architecture known as a redundant successive approximation ADC architecture. In such an architecture, DAC 112 is constructed using sub-binary weighted reference elements that result in regions in which the DAC 112 has redundant codes. In embodiments of the present invention, DAC 112 is implemented using sub-binary weighted reference elements that result in redundant code regions where a plurality of DAC input codes map to a single DAC output value of a DAC output signal. In some embodiments, the sub-binary weighted elements may have repeated weights, for example, [8, 4, 2, 2, 1]. Alternatively, any combination of repeated weights may be used for all of the embodiments described herein. Because of these redundant codes regions, an error in the bits corresponding to the sub-binary weighted reference elements can be corrected during subsequent successive approximation cycles. In such embodiments, the resulting output code SAR<N:0> may not result in a properly scaled binary representation of input voltage V in that is usable by further processing circuits. As such, code mapping circuit 114 may be used to map sub-binary weighed code SAR <N:0> to a binary weighted output value out<M:0> as explained further below.

In order to represent 4096 output levels, a conventional 12-bit DAC having binary weighted reference elements might have relative assigned weights $W_{11}$ to $W_0$ of:

$W_{11}=2048$
$W_{10}=1024$
$W_9=512$
$W_8=256$
$W_7=128$
$W_6=64$
$W_5=32$
$W_4=16$
$W_3=8$
$W_2=4$
$W_1=2$
$W_0=1$, such that the output level is $D_{11}W_{11}+D_{10}+W_{10}+D_9W_{10}+D_9W_9+D_8W_8+D_7W_7+D_6W_6+D_5W_5+D_4W_4+D_3W_3+D_2W_2+D_1W_1+D_0W_0$, and $D_{11}$ to $D_0$ is the input data word to the DAC.

In one example embodiment, in order to represent 4096 output levels, DAC 112 is implemented using a redundantly coded DAC having 13 bits with the following relative assigned weights $W_{12}$ to $W_0$ of:

$W_{12}=1776$
$W_{11}=1024$
$W_{10}=576$
$W_9=320$
$W_8=176$
$W_7=96$
$W_6=64$
$W=32$ $W_4=16$
$W_3=8$
$W_2=4$
$W_1=2$
$W_0=1$, such that the output level is $D_{12}W_{12}+D_{11}W_{11}+D_{10}+W_{10}+D_9W_{10}+D_9W_9+D_8W_8+D_7W_7+D_6W_6+D_5W_5+D_4W_4+D_3W_3+D_2W_2+D_1W_1+D_0W_0$, and $D_{12}$ to $D_0$ is the input data word to DAC 112. As shown, weights $W_{12}$ to $W_7$ are arranged in a sub-binary manner with respect to each other, while remaining weights $W_7$ to $W_0$ are related to each other in a binary fashion. It should be understood that in alternative embodiments, all weights could be related to each other in a sub-binary fashion or the allocation of sub-binary weights and binary weights could be different from the example shown.

In various embodiments, each of the weights $W_{12}$ to $W_0$ represents a reference element in the structure of DAC 112. For example, in a charge redistribution DAC, weights $W_{12}$ to $W_0$ may represent the relative sizes of capacitors used within the charge redistribution DAC, while in a current DAC, weights $W_{12}$ to $W_0$ may represent the relative currents produced by the various reference currents sources in the current DAC. It should be understood, however, that the charge redistribution DAC and the current DAC are just two examples of DACs that could be used to implement DAC 112. In various embodiments of the present invention, any DAC that utilizes scaled or weighted reference structures or components to generate an analog signal from a digital input word may be used.

Because SAR output word SAR<N:0> of successive approximation logic 108 is sub-binary weighted, code mapping circuit 114 is used to convert SAR output word SAR<N:0> to output word OUT<M:0> having a binary representation. In some embodiments, code mapping circuit 114 is configured to multiply each bit of SAR<N:0> with its corresponding relative weight and add each weighted result together. For example, code mapping circuit may be configured to perform the following calculation:

SAR<12>*$W_{12}$+SAR<11>*$W_{11}$+SAR<10>*$W_0$+
SAR<9>*$W_9$+SAR<8>*$W_8$+SAR<7>*$W_7$+
SAR<6>*$W_6$+SAR<5>*$W_5$+SAR<4>*$W_4$+
SAR<3>*$W_3$+SAR<2>*$W_2$+SAR<1>*$W_1$+
SAR<0>*$W_0$.

The above calculation may be performed digitally using circuits and methods known in the art. For example, in some embodiments, a lookup tabled could be employed. Alternatively, each term of the equation above could be accumulated on a bit-by-bit basis during each successive approximation cycle. For example, at the end of the first successive approximation cycle, the quantity SAR<12>*$W_{12}$ could be calculated and stored in an accumulator; at the end of the second successive approximation cycle, SAR<11>*$W_{11}$ could be calculated and then accumulated with the previous result, and so on until the conversion is complete. In further embodiments, other methods of converting a sub-binary weighted word to a binary representation could be employed to implement code mapping circuit 114.

Figure 1B:
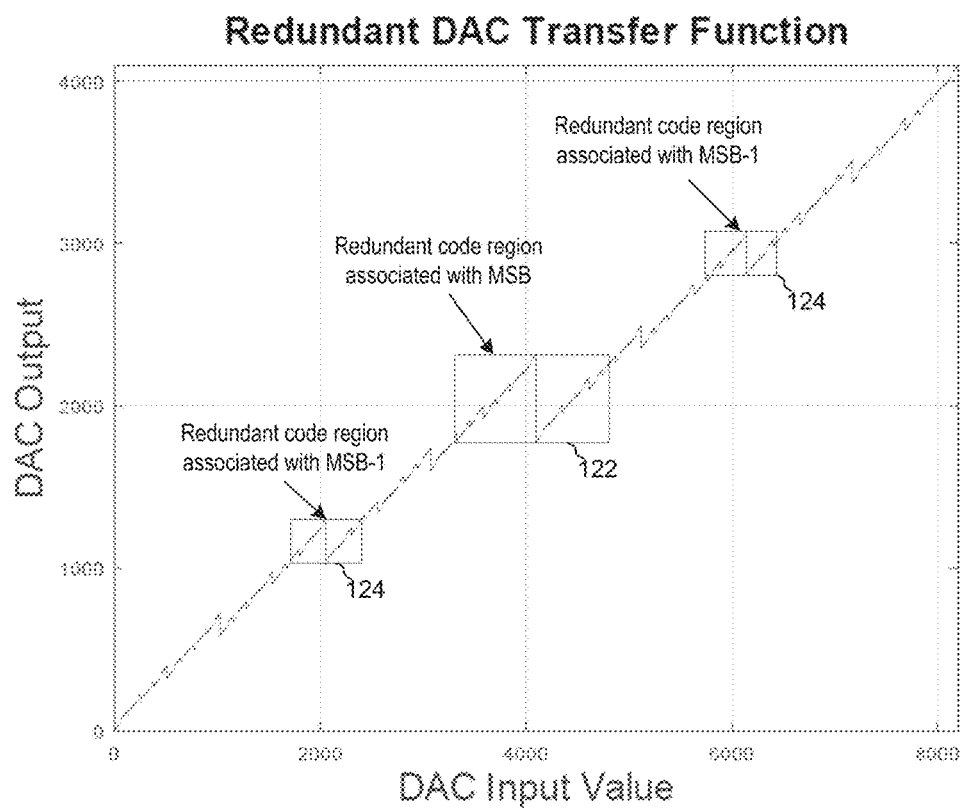
FIG. 1B is a DAC transfer function for a redundant DAC used to implement the successive approximation ADC of FIG. 1A.

FIG. 1B illustrates a graph showing an example embodiment redundant DAC transfer function that implements the above-described combination of sub-binary and binary weights. As shown, the DAC transfer function is a two-dimensional plot showing the DAC input value (e.g., $D_{12}$ to $D_0$) on the x-axis, and the unsealed DAC output level on the y-axis. It should be understood that in various embodiments, the DAC output may be scaled according the specific embodiment and its specifications.

As shown, the relationship between the DAC output and the DAC input code is non-monotonic due the sub-binary weighting of the reference elements. This non-monotonicity results in redundant DAC input codes such that more than one DAC input code may produce the same DAC output value. For example, redundancy window 122 centered at about DAC output 2048 has a group of redundant codes associated with the transition of most significant bit (MSB) SAR<12>, and redundant code regions 124 centered at about DAC outputs 2935 and 1159 has a group of redundant codes associated with the transition of the second most significant bit SAR<11>. These redundancy windows 122 and 124 (also referred to as "redundancy regions") may be associated with a particular bit of the DAC input word, and provides error tolerance for input signals corresponding with these redundancy windows such that errors due to offset, slow settling or noise within redundancy windows 122 and 124 are correctable during later successive approximation cycles.

In some cases, even when errors due to slow settling are corrected using sub-binary DAC 112, some non-linearities due to mismatch between reference elements in DAC 112 may still exist. This mismatch between reference elements may be due to random mismatch between reference elements that occur due to statistical variation in the physical geometry, doping or other parameter of each reference element, and/or may be due systemic mismatch. This mismatch may manifest itself in non-linearities that effectively reduce the SFDR in some systems.

Figure 1C:
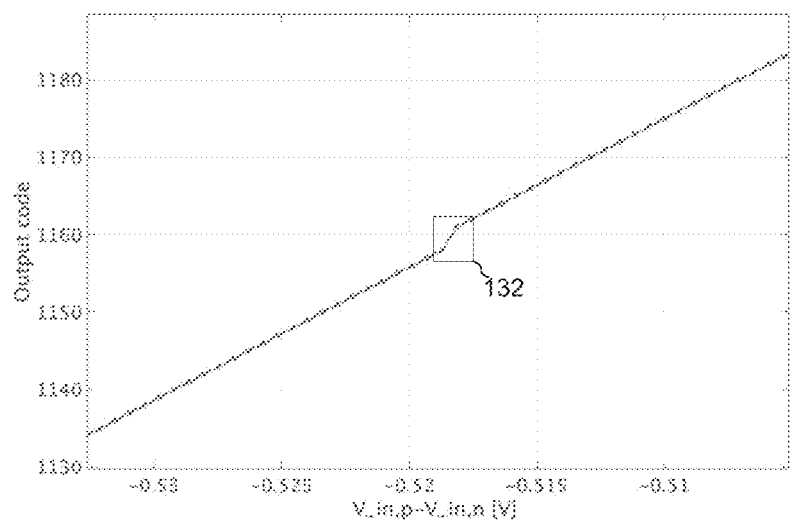
FIGS. 1C and 1D are graphs showing the effect of mismatched reference elements within a DAC.
Figure 1D:
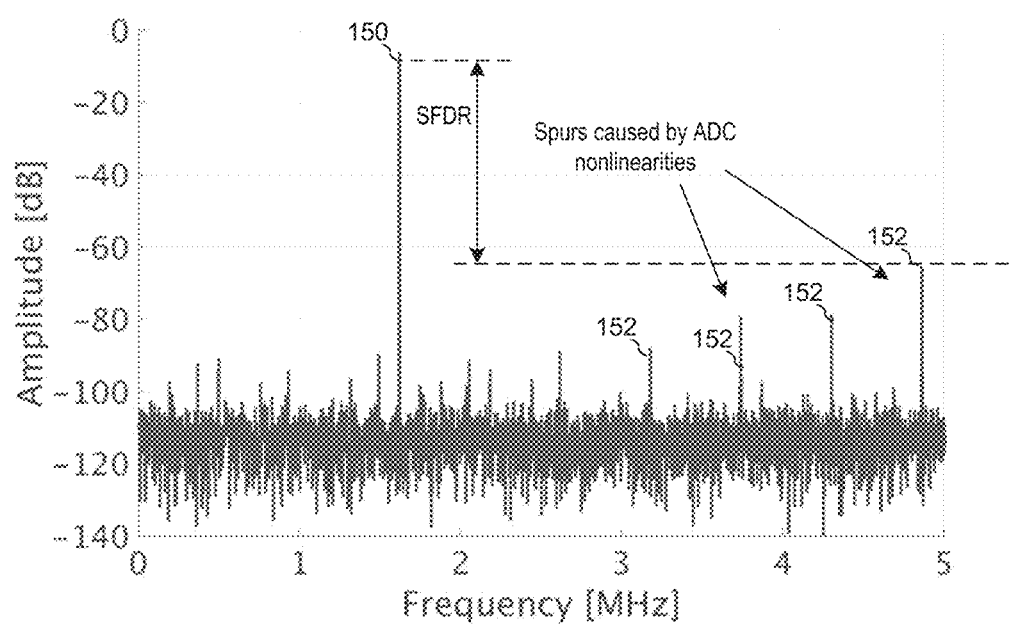

FIG. 1C illustrates a plot of digital output code versus input voltage for a successive approximation converter having a DAC with mismatched reference elements. As shown the output code has a mismatch induced non-linearity 132 in which the output code advances from output code 1158 to output code 1161, thereby skipping two output codes. FIG. 1D illustrates an FFT of an output of a successive approximation converter having mismatched induced non-linearity. Signal 150 represents a sinusoidal tone introduced at the input of the successive approximation ADC, and spurs 152 represent distortion caused by the non-linearities. The presence of spurs 152 are indicative of a reduced SFDR and may degrade the performance of various systems. For example, in a radar system, spurs 152 may cause the detection of a non-existing or "ghost targets".

In various embodiments, the effect of such non-linearities may be reduced by adding an offset via offset logic 110 during one or more successive approximation cycles, as is further explained with respect to FIGS. 2A-2E.

Figures 2A, 2B, 2C:
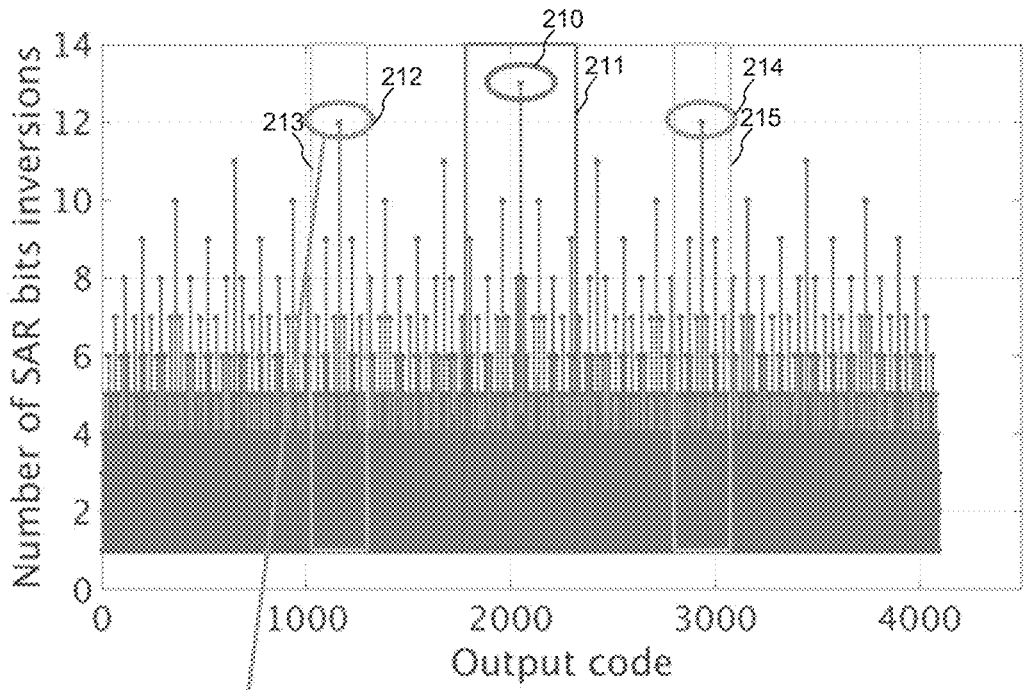
FIGS. 2A, 2B, 2C, 2D and 2E are graphs and tables illustrating the operation of an embodiment successive approximation ADC.

FIG. 2A illustrates a graph of number of bit inversions between adjacent sub-binary output codes SAR<12:0> with respect to output code for a redundant successive approximation ADC having reference elements weighted according to $W_{12}$ to $W_0$ being [1776, 1024, 576, 320, 176, 96, 64, 32, 16, 8, 4, 2, 1]. As shown, the highest number of bit inversions occurs at major code transitions. For example, the highest number of bit inversions occurs at the transition between output code 2047 and 2048 (designated as reference number 210) when all thirteen bits of SAR<12:0> transition. The next highest number of bit transitions occurs between output codes 1159 and 1160 (designated as reference number 212) and between output codes 2935 and 2936 (designated as reference number 214). Regions 213, 211 and 215 represent the redundancy windows associated with and by construction centered on the illustrated major code transitions.

FIG. 2B illustrates a table showing how the output word SAR<12:0> transitions between 1159 and 1160. As shown, all bits SAR<11:0> are inverted between adjacent output codes 1159 and 1160. In various embodiments, the higher number of bit inversions there are between adjacent output codes, the higher the probability of differential non-linearity seen between the adjacent output codes. This is because a larger number of potentially mismatched reference elements are being switched at the same time.

In various embodiments, the number of bit transitions at major code inversions can be reduced by selectively substituting redundant input codes to DAC 112 such that the number of bit transitions between at least two adjacent output codes is reduced. Reducing the number of bit transitions between adjacent output codes leads to a smaller number of potentially mismatched reference elements are being switched at the same time, which may result in reduced differential non-linearity. The manner in which the number of bit transitions may be reduced is illustrated in the table of FIG. 2C. Similar to FIG. 2B, output code 1159 is represented as "0 0111 0101 0011." However, instead of output code 1160 being mapped as "0 1000 1010 1000" as in the case of FIG. 2B, output code 1160 is mapped as redundant code "0 0111 0101 1000," instead. This remapping of output code "0 1000 1010 1000" to redundant output code "0 0111 0101 1000" results in only four bit inversions between output codes 1159 and 1160 instead of twelve bit inversions.

In various embodiments, the output code is remapped by adding an offset in the code at the input to DAC 112 during at least one successive approximation cycle. In this specific example, the offset is added during the second successive approximation cycle when SAR<11> is being evaluated. In various embodiments, this offset is applied to at least one undecided bit of the DAC input word having a lower weight than a bit of the DAC input word associated with a present successive approximation cycle. This offset effectively changes the successive approximation trajectory at codes 1160, which results in the redundant code.

Figure 2D:
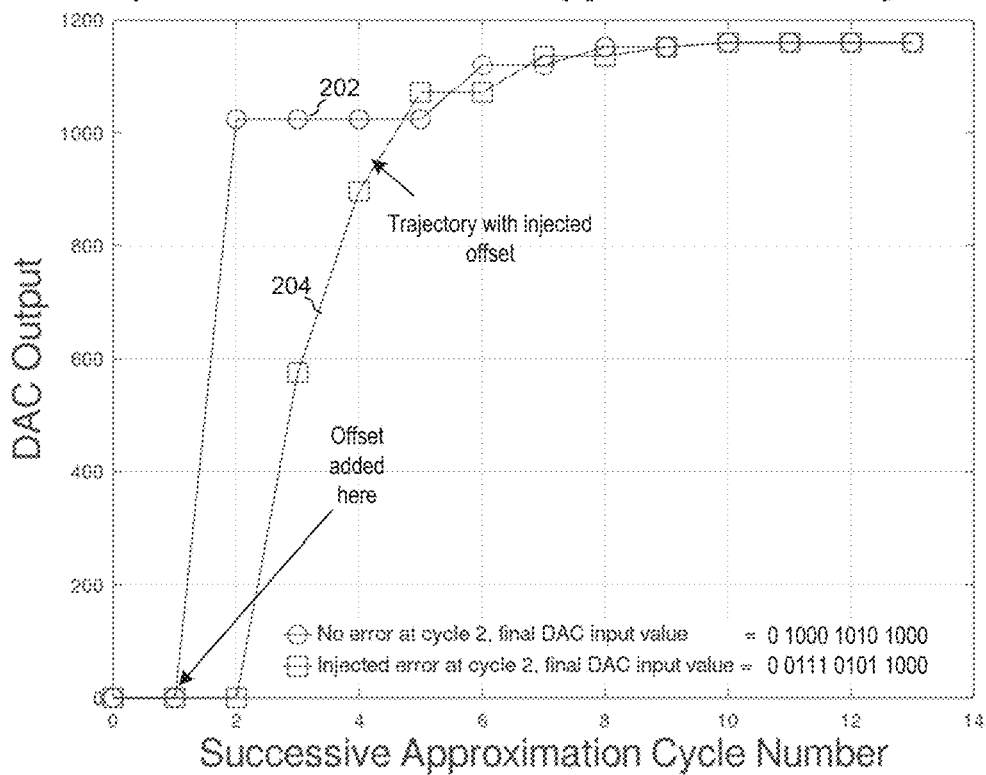

FIG. 2D illustrates a graph comparing a successive approximation trajectory 202 in which no offset is added, and a successive approximation trajectory 204 in which offset is added for an output code of 1160 in a redundant successive approximation ADC that includes a DAC 112 implemented as a split charge redistribution DAC, as is described below with reference to FIG. 3A. In an embodiment, each DAC of the split charge redistribution DACs has reference elements weighted according to $W_{12}$ to $W_0$ being [1776, 1024, 576, 320, 176, 96, 64, 32, 16, 8, 4, 2, 1]. In this example, comparator 106 is configured to output a high level when the input to the bigger than zero and output a low level when the input to the comparator is less than zero. It should be understood, however, that comparators in alternative embodiments may behave differently. (e.g., some comparators may be implemented to provide an active low output instead of an active high output.) In the graph illustrated in FIG. 2D, the x-axis represents the successive approximation cycle number, and the y-axis represents the ADC output code during each successive approximation cycle.

As shown, the successive approximation sequence of trajectory 202 in which no offset is added is [0 1024 1024 1024 1024 1120 1120 1152 1152 1160 1160 1160 1160]. In an embodiment, the input code to DAC 112 is "0 1000 1010 1000" at the end of the successive approximation cycles for trajectory 202. On the other hand, successive approximation sequence of trajectory 204 in which an error is introduced during successive approximation cycle number 1 (corresponding to the next most significant bit SAR<11> of SAR<12:0>) is [0 0 576 896 1072 1072 1136 1136 1152

1160 1160 1160 1160]. In an embodiment, the input code to DAC 112 is "0 0111 0101 1000" and "0 1000 1010 1000" at the end of the successive approximation cycles for trajectory 204. It should be appreciated that even though the trajectories 202 and 204 and the final DAC input codes are different, both codes map to a weighted output value of 1160. Effectively DAC input codes "0 0111 0101 1000" and "0 1000 1010 1000" map to the same output space within a redundancy region (e.g., redundant code region 124 shown in FIG. 1B) associated with a reference element comprising a sub-binary weight.)

In the present example, an output code of "0 0111 0101 0111" results for an input of 1159 for both the offset (trajectory 204) and non-offset case (trajectory 202). Accordingly, there will be 12 bits changing state between output codes 1159 and 1160 for the non-offset case, but there will only be 4 bits changing state between output codes 1159 and 1160 for the offset case.

Figure 2E:
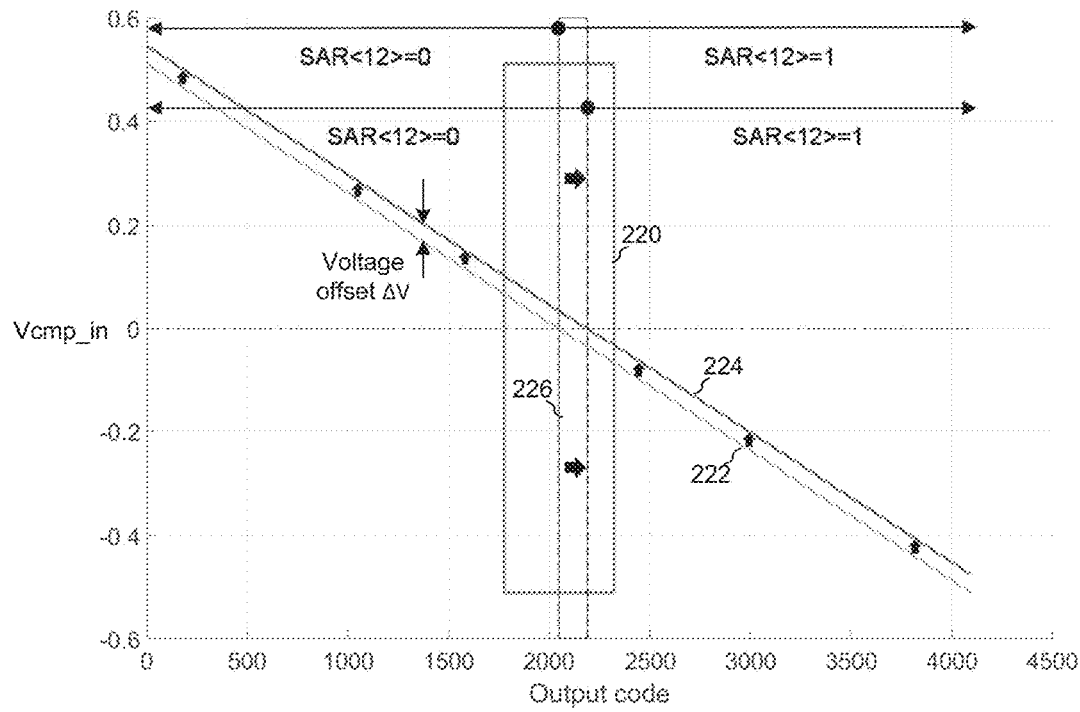

FIG. 2E illustrates a graph illustrating the input voltage (Vcmp_in) at the input of comparator 106 and the resulting output code for the most significant bit SAR<12> for an input voltage without offset (curve 222), and an input voltage with a $\Delta V=35$ mV offset (curve 224). Box 220 represents a redundancy window associated with most significant bit SAR<12> in which an error in the SAR<12> comparison decision is correctable during later successive approximation cycles. The resulting area in which an error on the SAR<12> decision is forced by the applied offset is indicated by region 226.

Without any offset and supposing a noiseless system, the 0-1 transition for most significant bit SAR<12> is exactly in the middle of the redundancy window. In this condition, the number of SAR bits inversions between two consecutive output codes will be maximum and equal to 13 when crossing this threshold for this particular example. By applying an offset $\Delta V$ at the input of the comparator, the 0 to 1 threshold is shifted away from the middle of the redundancy window 220, to a place in which the number of SAR bits inversions is smaller, as indicated by shifted curve 224. This shifting of the input forces an error on the SAR<12> decision with respect to codes that fall within region 226. As long as the decision error falls within redundancy window 220, the codes are correctable and result in a modified SAR code that may be used to reduce the number of bit transitions in consecutive codes. In some embodiments, the larger the voltage offset $\Delta V$, the smaller number of SAR bits inversions when crossing the new threshold.

In various embodiments offset voltage $\Delta V$ may be selected by taking into account the width of redundancy window 220 and the expected comparator offset and noise such that there is sufficient margin that the sum of the offset voltage $\Delta V$ and expected comparator offset and noise remains within redundancy window 220. As mentioned above voltage offset $\Delta V$ may be achieved by offsetting the DAC input code using offset logic 110. However, other methods of producing voltage offset $\Delta V$ during a particular successive approximation cycle may be used. For example, for embodiments in which DAC 112 is implemented using a charge redistribution DAC, switching capacitors not belonging to the DAC but connected to the input of the comparator may be used to produce a voltage offset. A voltage offset may also be produced by unbalancing the internal nodes of comparator 106.

It should be understood that the example of FIG. 2E is just one of many possible illustrative examples that describes the interaction between voltage offset $\Delta V$ and the operation of a successive approximation cycle. In alternative embodiments, other voltage offset $\Delta V$, redundancy windows, input voltage vs. code relationships, and bit positions may be used.

Figure 3A:
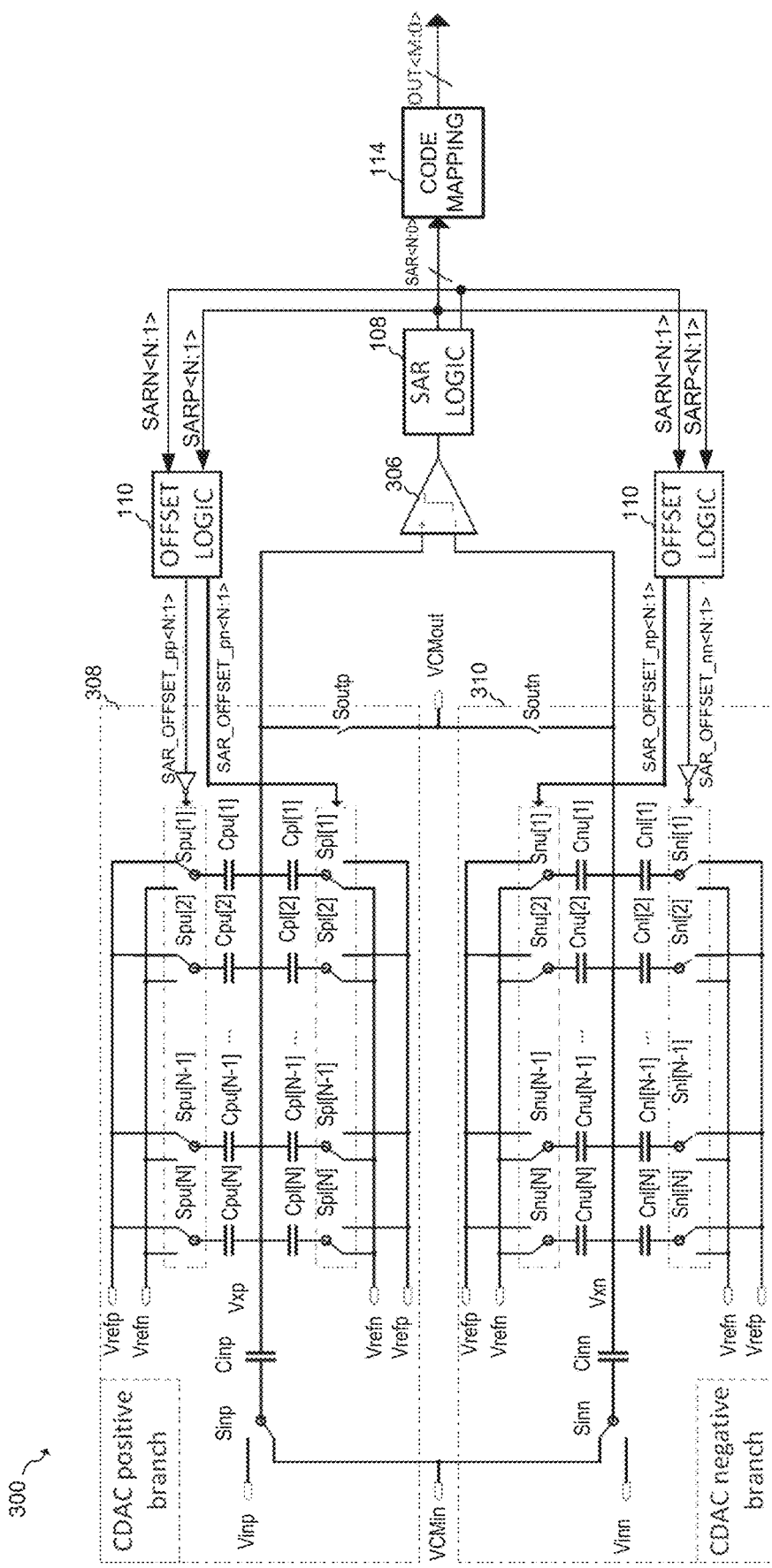
FIG. 3A illustrates a schematic of an embodiment successive approximation ADC that utilizes charge redistribution DACs.

FIG. 3A illustrates an embodiment redundant successive approximation ADC 300 that is implemented differentially using redundant charge redistribution DACs 308 and 310. As shown, ADC 300 includes a positive branch charge redistribution DAC 308 and a negative branch charge redistribution DAC 310 that are configured to sample and hold a differential input voltage Vinp−Vinn, perform a differential digital-to-analog conversion, and subtract the digital-to-analog converted value from the sampled and held differential input voltage. In some embodiments, the combination of positive branch charge redistribution DAC 308 and negative branch charge redistribution DAC 310 effectively perform the functions of sample and hold circuit 102, DAC 112 and summing circuit 104 shown and described above with respect to FIG. 1A. Comparator 306 is coupled to the outputs of positive branch charge redistribution DAC 308 and negative branch charge redistribution DAC 310; successive approximation logic 108 is coupled to the output of comparator 306; and code mapping circuit 114 is coupled to the output of successive approximation logic 108. One instance of offset logic 110 is coupled between the output of successive approximation logic 108 and the input of positive branch charge redistribution DAC 308, while another instance of offset logic 110 is coupled between the output of successive approximation logic 108 and the input of negative branch charge redistribution DAC 310.

As shown, each of positive branch charge redistribution DAC 308 and negative branch charge redistribution DAC 310 comprises two weighed arrays of capacitors. Positive branch charge redistribution DAC 308 includes an upper array of N capacitors Cpu[N] to Cpu[1] and corresponding switches Spu[N] to Spu[1], and a lower array of N capacitors Cpl[N] to Cpl[1] and corresponding switches Spl[N] to Spl[1]. Similarly, negative branch charge redistribution DAC 310 includes an upper array of N capacitors Cnu[N] to Cnu[1] and corresponding switches Snu[N] to Snu[1], and a lower array of N capacitors Cnl[N] to Cnl[1] and corresponding switches Snl[N] to Snl[1]. In an embodiment, the top plates of each capacitor in the upper and lower arrays of positive branch redistribution DAC 308 shares a common node Vxp; and the top plates of each capacitor in the upper and lower arrays of negative branch redistribution DAC 310 shares a common node Vxn. Positive branch charge redistribution DAC 308 includes input capacitor Cinp having a bottom plate selectively coupled between positive input voltage node Vinp or input common mode voltage node VCMin via switch Sinp, and includes output switch Soutp that is configured to couple the top plates of its capacitor array to output common mode voltage node VCMout. In a similar manner negative branch charge redistribution DAC 310 includes input capacitor Cinn having a bottom plate selectively coupled between negative input voltage node Vinn or input common mode voltage node VCMin via switch Sinn, and includes output switch Soutn that is configured to couple the top plates of its capacitor array to output common mode voltage node VCMout.

During operation, positive branch charge redistribution DAC 308 samples positive input voltage Vinp on bottom plate of input capacitor Cinp by connecting the bottom plate of input capacitor Cinp to input voltage node Vinp via switch Sinp, and by coupling the top plate of capacitor Cinp (along with the top plate of array capacitors Cpu[N] to Cpu[1] and array capacitors Cpl[N] to Cpl[1]) to voltage node VCMout via switch Soutp. As such, voltage Vinp−VCMout is applied to input capacitor Cinp. During this sampling phase the bottom plates of array capacitors Cpu[N] to Cpu[1] are coupled to positive reference voltage Vrefp, and the bottom plates of array capacitors Cpl[N] to Cpl[1] are coupled to negative reference voltage Vrefn. Similarly, negative branch charge redistribution DAC 310 samples negative input voltage Vinn on the bottom plate of input capacitor Cinn by connecting the bottom plate of input capacitor Cinn to input voltage node Vinn via switch Sinn, and by coupling the top plate of capacitor Cinn (along with the top plate of array capacitors Cnu[N] to Cnu[1] and array capacitors Cnl[N] to Cnl[1]) to voltage node VCMout via switch Soutn. As such, voltage Vinn−VCMout is applied to input capacitor Cinp. During the sampling phase the bottom plates of array capacitors Cnu[N] to Cnu[1] are coupled to negative reference voltage Vrefn, and the bottom plates of array capacitors Cnl[N] to Cnl[1] are coupled to positive reference voltage Vrefn.

After the differential input voltage Vinp−Vinn has been sampled, a redistribution phase of the first successive approximation cycle is performed. In one embodiment, at the beginning of this phase, all the DAC capacitors maintain the state that they had during the sampling phase, which is the following: the bottom plates of array capacitors Cpu[N] to Cpu[1] are coupled to positive reference voltage Vrefp, the bottom plates of array capacitors Cpl[N] to Cpl[1] are coupled to negative reference voltage Vrefn, the bottom plates of array capacitors Cnu[N] to Cnu[1] are coupled to negative reference voltage Vrefn, and the bottom plates of array capacitors Cnl[N] to Cnl[1] are coupled to positive reference voltage Vrefp. An exception to this would be if offset logic 110 is configured to apply a DAC offset to one or more undecided bits, in which case the bottom plates of the capacitors corresponding to these one or more undecided bits would be coupled to different voltages in order to effect the offset described herein.

At the end of the redistribution phase of the first successive approximation cycle the value of the Vxp-Vxn voltage is proportional to the value of the sampled differential input Vinp-Vinn. The comparator 306 determines whether top plate voltage Vxp of positive branch charge redistribution DAC 308 exceeds the top plate voltage Vxn of negative branch charge redistribution DAC 310. If comparator 306 determines that voltage Vxp exceeds voltage Vxn, the most significant bit SARP<N> of SARP<N:1> is set low and the most significant bit SARN<N:1> is set high. This causes the bottom plate of capacitor Cpu[N] to be coupled to negative reference voltage Vrefn and the bottom plate of capacitor Cnl[N] to be coupled to positive reference voltage Vrefp. In some embodiments, the bottom plates capacitors Cpl[N] and Cnu[N] maintain the same state as they were during the sampling phase. On the other hand, if comparator 306 determines that voltage Vxp does not exceed voltage Vxn, the most significant bit SARP<N> is set high and SARN<N> is set low. This causes the bottom plate of capacitor Cpl[N] to be coupled to positive reference voltage Vrefp, and causes the bottom plate of capacitor Cnu[N] to be coupled to negative reference voltage Vrefn. In some embodiments, the bottom plates of the capacitors Cpu[N] and Cnl[N] maintain the same state as they were during the sampling phase. In any case, the comparator decision is translated into a change of the state of part of the capacitors, which results in a variation of the Vxp-Vxn voltage. The comparator 306 makes a decision based on this new voltage value and according to this decision the SAR LOGIC block sets the SARP<N−1> and SARN<N−1> bits. Similarly to the previous state, a variation of the SARP<N−1> and SARN<N−1> bit causes a change in the state of the caps Cpu[N−1], Cpl[N−1], Cnu[N−1], and Cnl[N−1] that is translated into a new adjustment of the Vxp-Vxn voltage. This cycle is repeated until all the SAR bits are defined.

In some embodiments, the bottom plates of capacitors Cpu[N] to Cpu[1] are selectively coupled to positive reference voltage Vrefp or negative reference voltage Vrefn via switches Spu[N] to Spu[1]; the bottom plates of capacitors Cpl[N] Cpl[1] are selectively coupled to positive reference voltage Vrefp or negative reference voltage Vrefn via switches Spl[N] to Spl[1]; the bottom plates of capacitors Cnu[N] Cnu[1] are selectively coupled to positive reference voltage Vrefp or negative reference voltage Vrefn via switches Snu[N] to Snu[1]; and the bottom plates of capacitors Cnl[N] Cnl[1] are selectively coupled to positive reference voltage Vrefp or negative reference voltage Vrefn via switches Snl[N] to Snl[1]. In some embodiments, switches Spu[N] to Spu[1] are controlled by a control signals SAR_OFFSET_pp<N:1>; switches Spl[N] to Spl[1] are controlled by a control signals SAR_OFFSET_pn<N:1>; switches Snu[N] to Snu[1] are controlled by control signals SAR_OFFSET_np<N:1>; and switches Snl[N] to Snl[1] are controlled by control signals SAR_OFFSET_nn<N:1>. In various embodiments, SAR_OFFSETpp<N:1>, SAR_OFFSET_pn<N:1>, SAR_OFFSET_np<N:1>, SAR_OFFSET_nn<N:1> are generated using split capacitor switching algorithms known in the art. Alternatively, SAR_OFFSET_pn<N:1> may be the inverse of SAR_OFFSET_pp<N:1>, and SAR_OFFSET_nn<N:1> may be the inverse of SAR_OFFSET_np<N:1>. In other embodiments, SAR_OFFSET_pn<N:1> and/or SAR_OFFSET_nn<N:1> may maintain the same state throughout the successive approximation cycles.

During operation, for undecided bits i that have a lower or equal bit value than particular bit associated with the present successive approximation cycle, SARP<i>=SARN<i>=0. For bits j having higher bit values associated with previously performed successive approximation cycles, for a high bit value SARP<j>=1 and SARN<j>=0, while for a low bit value SARP<j>=0 and SARN<j>=1.

In embodiments in which an offset is applied to undecided bits k, SAR_OFFSET_pp<k>, SAR_OFFSET_pn<k>, SAR_OFFSET_np<k> and SAR_OFFSET_nn<k> can be controlled in various manners. For example, in one embodiment, a positive offset may be applied by connecting the bottom plate of capacitor Cpl[k] to positive reference voltage Vrefp and/or connecting the bottom plate of capacitor Cnl[k] to negative reference voltage Vrefn. This could be accomplished by setting SAR_OFFSET_pn<k>=0 and/or SAR_OFFSET_nn<k>=1. Alternatively or in addition to this, a negative offset may be applied by connecting the bottom plate of capacitor Cpu[k] to negative reference voltage Vrefn and connecting the bottom plate of capacitor Cnu[k] to positive reference voltage Vrefp. This could be accomplished by setting SAR_OFFSET_pp<k>=0 and SAR_OFFSET_np<k>=1.

In some embodiments, the control signals SAR_OFFSET_pn<N:1> SAR_OFFSET_pp<N:1>, SAR_OFFSET_nn<N:1> and SAR_OFFSET_np<N:1> are generated using offset logic 110. In other embodiments, the generation of one or more of these signals is implemented by digital control logic (not shown) resident within ADC 300. This digital logic may be implemented using digital logic circuits and systems known in the art. In various embodiments, each successive approximation cycle may be controlled synchronously using and external clock or may be controlled asynchronously according to synchronous and/or asynchronous successive approximation control methods known in the art.

In various embodiments, array capacitors Cpu[N] to Cpu[1], Cpl[N] to Cpl[1], Cnu[N] to Cnu[1], and Cnl[N] to Cnl[1], are weighted in a sub-binary manner. FIG. 3B illustrates one manner in which these capacitors could be weighted. For example, capacitors Cpu[12], Cpl[12], Cnu[12] and Cnl[12] may each have a weight of 111 unit capacitors corresponding to a normalized weight of 1776; Cpu[11], Cpl[11], Cnu[11] and Cnl[11] may each have a weight of 64 unit capacitors corresponding to a normalized weight of 1024; Cpu[10], Cpl[10], Cnu[10] and Cnl[10] may each have a weight of 36 unit capacitors corresponding to a normalized weight of 576; Cpu[9], Cpl[9], Cnu[9] and Cnl[9] may each have a weight of 36 unit capacitors corresponding to a normalized weight of 320; Cpu[8], Cpl[8], Cnu[8] and Cnl[8] may each have a weight of 20 unit capacitors corresponding to a normalized weight of 176; Cpu[7], Cpl[7], Cnu[7] and Cnl[7] may each have a weight of 11 unit capacitors corresponding to a normalized weight of 96; Cpu[6], Cpl[6], Cnu[6] and Cnl[6] may each have a weight of 4 unit capacitors corresponding to a normalized weight of 64; Cpu[5], Cpl[5], Cnu[5] and Cnl[5] may each have a weight of 2 unit capacitors corresponding to a normalized weight of 32; Cpu[4], Cpl[4], Cnu[4] and Cnl[4] may each have a weight of 1 unit capacitor corresponding to a normalized weight of 16; Cpu[3], Cpl[3], Cnu[3] and Cnl[3] may each have a weight of ½ of a unit capacitor corresponding to a normalized weight of 8; Cpu[2], Cpl[2], Cnu[2] and Cnl[2] may each have a weight of ¼ of a unit capacitor corresponding to a normalized weight of 4; and Cpu[1], Cpl[1], Cnu[1] and Cnl[1] may each have a weight of ⅛ of a unit capacitor corresponding to a normalized weight of 2. In some embodiments, the last redundant bit 0 is not associated with any physical capacitor in the DAC. Rather the last redundant bit is given by a decision made by comparator 306 in response to the last successive approximation cycle.

In various embodiments, array capacitors Cpu[N] to Cpu[1], Cpl[N] to Cpl[1], Cnu[N] to Cnu[1], and Cnl[N] to Cnl[1] may be implemented using the same number, or a multiple of the number of unit capacitors designated for each capacitor according to the table in FIG. 3B. In some embodiments, the sub-unit capacitors associated with one or more of redundant bits 0 to 3 may be implemented using capacitors that are physically smaller than the unit capacitor. In an embodiment, the capacitance associated with each unit capacitor may be between about 90aF and about 80 fF; however, values outside of this range may also be used depending on the particular embodiment and its specifications. In one embodiment, input capacitors Cinp and Cinn have value of about 270 fF. Alternatively, other capacitances may be used.

FIGS. 3C and 3D illustrate two tables that show the operation of successive approximation logic 108. In particular, FIG. 3C is associated with the value of SARP<12:0>, where SARP<12:0>=SAR<12:0>, and FIG. 3D is associated with the value of SARN<12:0>. However, in some embodiments, such as the embodiment of FIG. 3A, only SARP<12:1> and SARN<12:1> are routed to DACs 308 and 310, respectively. Each row in each table is associated with a particular successive approximation cycle. The designation C[1] represents the output of comparator 306 that is associated with the ith bit of the SAR output SARP<12:0>, and the designation !C[1] represents the inverse of the output of comparator 306 that is associated with the ith bit of the SAR output SARN<12:0>.

With reference to FIG. 3C, the first row of the table represents the first successive approximation cycle. As shown, SARP<12> is held low along with remaining undecided bits SARP<11:0>. In the second cycle, SARP<12> is assigned the value C[12], which represents the comparator result for bit 12 in the first cycle, SARP<11> is assigned a low value, while the remaining while the remaining undecided bits SARP<10:0> are also held low. In the second cycle, SARP<12> is assigned the value C[12], which represents the comparator result for bit 12 in the first cycle, SARP<11> is assigned the value C[11], which represents the comparator result for bit 11 in the second cycle, SARP<10> is assigned a low value, while the remaining undecided bits SARP<9:0> are also held low. Successive approximation logic 108 continues in a similar manner for the remaining successive approximation cycles until the final comparison result C[0] has been received.

With reference to FIG. 3D, the first row of the table represents the first successive approximation cycle. As shown, SARN<12> is held low along with remaining undecided bits SARN<11:0>. In the second cycle, SARN<12> is assigned the value !C[12], which represents the inverse of the comparator result for bit 12 in the first cycle, SARN<11> is assigned a low value, while the remaining undecided bits SARN<10:0> are also held low. In the second cycle, SARN<12> is assigned the value !C[12], which represents the inverse of the comparator result for bit 12 in the first cycle, SARN<11> is assigned the value !C[11], which represents the inverse of the comparator result for bit 11 in the second cycle, and SARN<10> is assigned a low value, while the remaining while the remaining undecided bits SARN<9:0> are also held low. Successive approximation logic 108 continues in a similar manner for the remaining successive approximation cycles until the final inverse comparison result !C[0] has been received.

In various embodiments, successive approximation logic 108 is implemented using successive approximation circuits and systems known in the art. In one embodiment, successive approximation logic 108 is implemented using a shift register with associated control logic, a state machine, or other digital logic implementation known in the art. In some embodiments, successive approximation logic 108 may be implemented using a programmable processor.

Comparator 306 may be implemented using comparator circuits and systems known in the art. For example, comparator 306 may be implemented using an amplifier, a clocked comparator, a Schmidt trigger, or other circuit suitable for comparing two voltages.

FIG. 3E illustrates a table that shows the operation of offset logic 110 in conjunction with successive approximation logic 108. As shown, the offset DAC input word SAR_OFFSET_pp<12:0> is similar to output SARP <12:0> of successive approximation logic with the exception that offset is induced in some of the undecided bits during the second successive approximation cycle. While the table of FIG. 3D shows an induced offset during the second successive approximation cycle, which corresponds to decisions made for SARP<11> and SARN<11> as a specific example, it should be understood that offsets of various magnitudes may be added to the undecided bit during one or more successive approximation cycles depending on the particular embodiment and its specifications. It should also be understood that tables 3C, 3D and 3E representing a system using a 13 bit DAC input word may be modified to support a DAC input word of various numbers of bits depending on the details of the particular system. In various embodiments, SAR_OFFSET_pn<12:0>, SAR_OFFSET_np<12:0> and SAR_OFFSET_nn<12:0> may be offset in a similar or different manner as SAR_OFFSET_pp<12:0> shown in FIG. 3E.

FIG. 3F illustrates an example circuit implementation for offset logic 110 in accordance with an embodiment of the present invention. As shown, each bit in successive approximation logic 108 output word SAR<12:1> (which may be coupled to SARP<12:1> or SAPN<12:1> in the case of the split DAC shown in FIG. 3A) has associated with it an offset circuit 322 having a bit width of one. Each offset circuit 322 includes a 2:1 multiplexer 324 that selects either the output SAR<i> of successive approximation logic 108 or the output of k:1 multiplexer 326, which represents a selectable offset. This offset produced by multiplexer 326 is selected when the output of AND gate 328 is high, which indicates that the following three conditions are met: (1) an offset mode is activated (Offset_on<i>=1), (2) the DACs 308 and 310 are currently operating a redistribution mode (Redistribution_on<i>=1), and (3) the current bit i is an undecided bit (Undecided<i>=1). In some embodiments, signals Offset_on<i>, Redistribution_on<i>, Undecided<i> and Decision_id are generated by control logic (not shown) resident within the ADC 300.

Multiplexer 326 is configured to select from a k offset values: Prog_offset<i, k:0>. Each of these values is selectable via decision identification signal Decision_id that indicates the present successive approximation cycle. In some embodiments, signals Prog_offset<i, k:0> may be stored in a memory or a register resident within ADC 300.

It should be appreciated that the implementation of offset logic 110 is just one of many possible ways of implementing offset logic 110. In alternative embodiments, other logically or functionally equivalent circuits could be used. In some embodiments, offset logic 110 may be implemented using an adder and a memory that provides a predetermined offset (or no offset) for each particular successive approximation cycle.

In one example embodiment, an ADC using the circuit of FIG. 3A with the capacitor weighting scheme of FIG. 3B has an input voltage range of 0.2 V to 1.4 V and a sampling rate of 20 MS/s. Based on simulations, when embodiment methods are used to reduce the number of bit transitions in consecutive codes, there is a 99% probability that the ADC will have an SFDR of at least 65 dBFS at a −1 dBFS input amplitude compared to a 99% probability that the ADC will have an SFDR of at least 60.1 dBFS at a −1 dBFS input amplitude when embodiment methods are not used to reduce the number of bit transitions in consecutive codes. Thus, in the particular embodiment of FIGS. 3A and 3B, embodiment methods may be used to improve the SFDR by almost 5 dB. In alternative embodiments, the improvement in SFDR may be different depending on the particular embodiment and its specifications.

As mentioned above, the table of FIG. 3B is just one example of many possible capacitor weighting schemes. FIG. 3G illustrates an alternative weighting scheme that results in a 14-bit DAC input word with larger redundancy regions that is configured to achieve 12 effective bits. An advantage of using a longer DAC input word is the ability to correct a larger magnitude of errors during operation of the ADC. This ability to correct a larger magnitude of error also enhances the ability of the ADC to reduce differential non-linearity errors when using embodiment linearity improvement methods described herein. In one example embodiment that utilizes a 14-bit DAC word, a total of fourteen successive approximation cycles are used to estimate the input value instead of 13 successive approximation cycles in the case of the 13-bit DAC input word. Based on simulations, when embodiment methods are used to reduce the number of bit transitions in consecutive codes with respect to the 14-bit embodiment of FIG. 3G, there is a 99% probability that the ADC will have an SFDR of at least 66.3 dBFS at a −1 dBFS input amplitude (compared to 65 dBFS using the 13-bit embodiment of FIG. 3B).

Figure 3H:
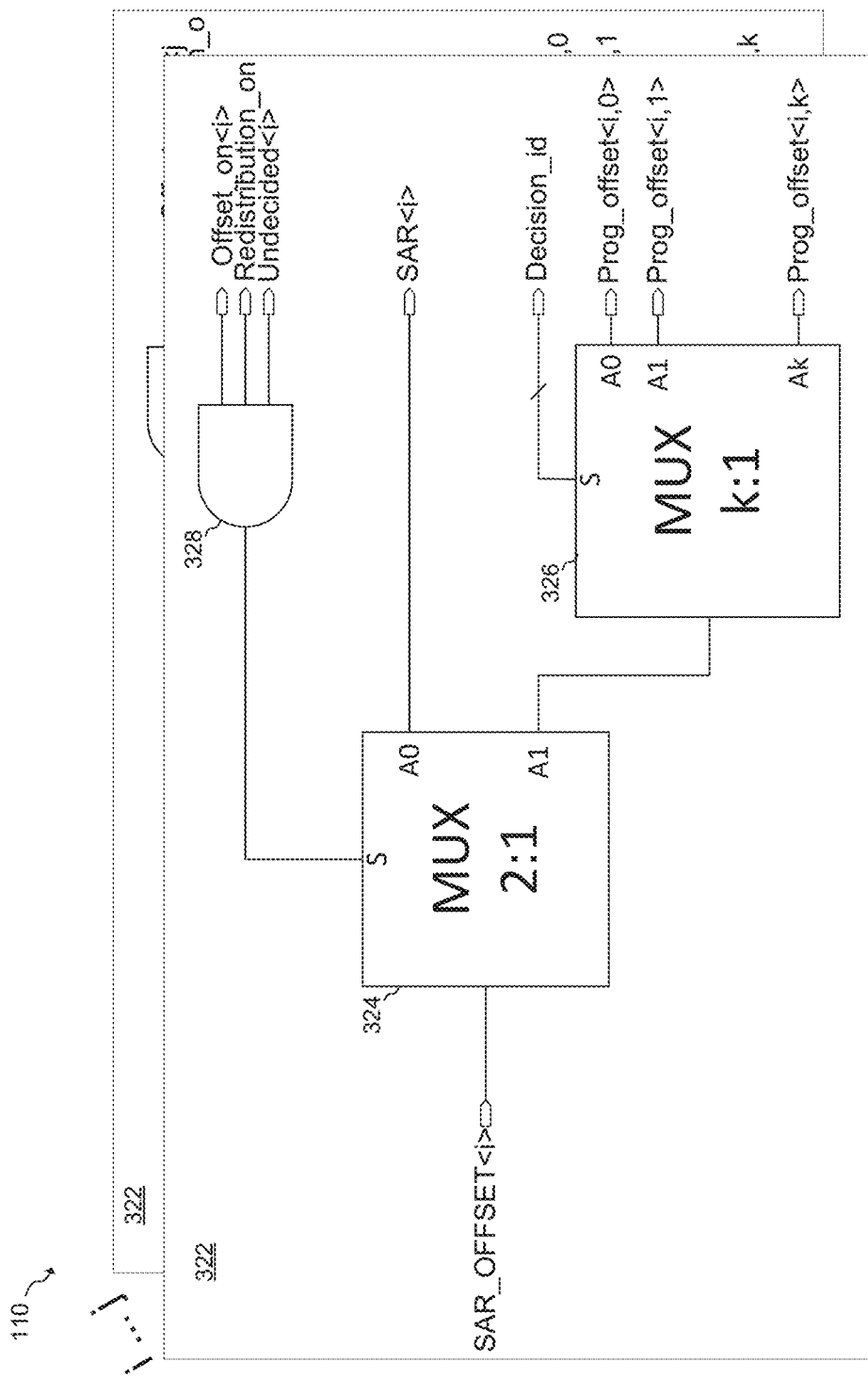
FIG. 3H illustrates a waveform diagram showing the operation of the successive approximation ADC of FIG. 3A.
Figure 3H:
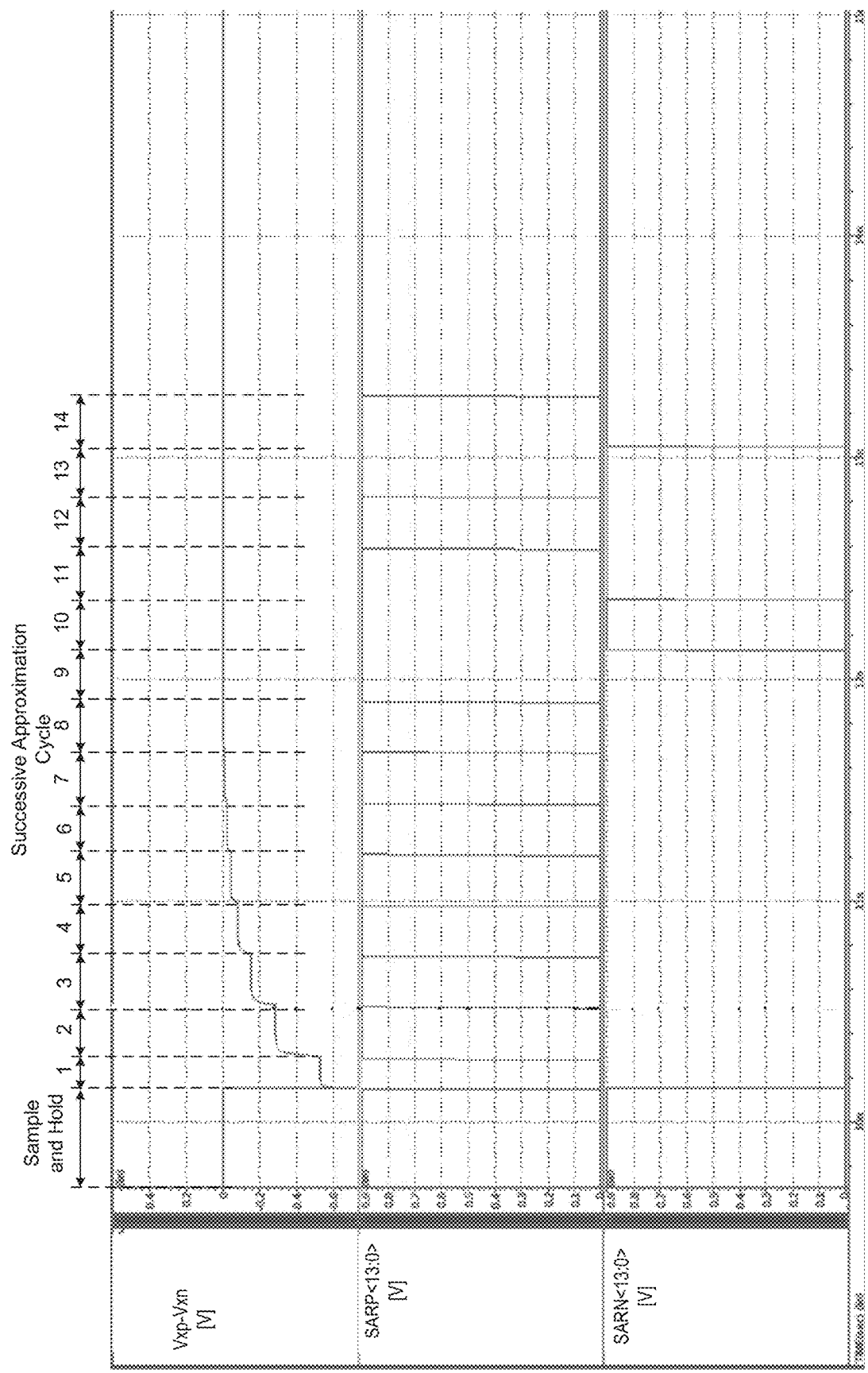

FIG. 3H illustrates a waveform diagram that shows the relationship between the differential voltage Vxp-Vxn at the output of DACs 308 and 310 and DAC input signals SARP<13:0> and SARN<13:0> for the 14-bit DAC embodiment of FIG. 3G. As shown, during the illustrated sample and hold period, differential voltage Vxp-Vxn is about zero due to both inputs to comparator 306 being coupled to voltage VCMout. At the beginning of the first successive approximation phase 1, all DAC input signals SARP<13:0> and SARN<13:0> are set to zero and differential voltage Vxp-Vxn is −0.55 V, which is proportional to the value of the sampled input. At the end of successive approximation phase 1, comparator 306 makes a first decision based on the value of differential voltage Vxp-Vxn. In this case SARP<13> is set to one, and SARN<13> remains at zero at the beginning of successive approximation phase 2. Via the feedback loop, the change in value of SARP<13> changes the state of the capacitors in charge redistribution DACs 308 and 310. This causes a redistribution of charge that modifies the value of differential voltage Vxp-Vxn. By the end of successive approximation phase 2, differential voltage Vxp-Vxn is about −0.3V. This process continues for the remaining eleven successive approximation cycles 3 to 14 until the entire conversion is complete. As is apparent from FIG. 3H, the differential voltage Vxp-Vxn approaches a final value of about 0 volts.

Figure 4A:
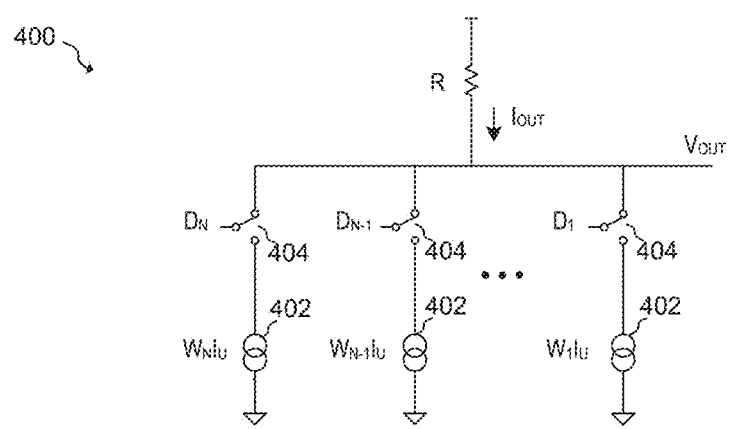
FIG. 4A illustrates a current DAC.

While the charge redistribution DAC-based embodiments described above with respect to FIGS. 3A to 3H are implemented using a differential capacitive charge redistribution DAC, embodiments of the present invention may also be implemented using a single ended charge redistribution DAC. In additional alternative embodiments of the present invention, other DAC topologies besides capacitive could be used to implement DAC 112 shown in FIG. 1A. For example, a current DAC, such as current DAC 400 shown in FIG. 4A may be used to implement DAC 112. As shown, current DAC 400 includes a plurality of switchable current sources coupled to resistor R. Each switchable current source is schematically represented as a weighted current source 402 coupled in series with a respective switch 404. The weights are shown as being $W_N$ to $W_1$, which are applied to a unit current $I_U$. In embodiments of the present invention, $W_N$ to $W_1$ are assigned sub-binary weights, such as the normalized weights shown in FIGS. 3B and 3G that implement a DAC with redundant input codes. During operation weighted current sources 402 are activated via their respective switches 404 using DAC input signals $D_N$ to $D_1$.

While each switchable current source is schematically represented as a weighted current sources 402 coupled in series with a respective switches 404 for simplicity of illustration, it should be understood that current DAC 400 could be implemented using any current DAC architecture known in the art including, but not limited to R-2R ladder based current DACs, current steering DAC, segmented current steering-based DACs, and the like. Similarly, weighted current sources 402 may be implemented in a variety of different ways, including, but not limited to MOS or BJT based current sources and/or MOS or BJT based current sources having resistor degeneration and/or MOS or BJT based current sources with cascodes.

Figure 4B:
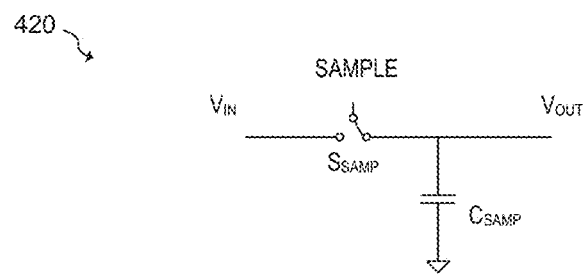
FIG. 4B illustrates a sample and hold circuit.

FIG. 4B illustrates an example sample and hold circuit 420 that could be used to implement sample and hold circuit 102 shown in FIG. 1A. As shown, sample and hold circuit 420 includes sampling switch $S_{SAMP}$ and sampling capacitor $C_{SAMP}$. During operation, sampling switch $S_{SAMP}$ is closed during a sampling phase in which the input voltage V in is applied to capacitor $C_{SAMP}$. During a hold phase, sampling switch $S_{SAMP}$ is opened and the sampled input voltage is held across capacitor $C_{SAMP}$. It should be understood that sample and hold circuit 420, as illustrated, is just one example of many possible sample and hold circuits that could be used to implement sample and hold circuit 102. In alternative embodiments, other sample and hold circuits known in the art may be used.

In various embodiments, embodiment linearity improvement systems and methods may be combined with other linearity improvement techniques. For example, dynamic element matching may be used in conjunction with embodiment redundant successive approximation ADCs. Dynamic element matching may be implemented in any of the embodiment ADCs described herein. In one example, dynamic element matching is implemented by the inclusion of a dynamic element matching controller within the DAC such as DAC 112 shown in FIG. 1A, DACs 308 and 310, shown in FIG. 3A and/or DAC 400 shown in FIG. 4A.

FIG. 5A illustrates an example charge redistribution DAC 500 that utilizes dynamic element matching. As shown, DAC 500 includes a charge redistribution capacitor array 512 made up of unit capacitors Cunit (also referred to as "sub-capacitors"). Each of these unit capacitors are coupled to a respective switch that is activated by a respective control signal Sout[m] to Sout[1]. Each control signal Sout[m] to Sout[1] is generated by dynamic element matching controller 510, which maps the n-bit DAC input word DACIN[n:1] to m control signals Sout[m] to Sout[1] according to their respective weights. For example, if DACIN[n] has a weight of 256, then 256 out of the m number of control signals Sout[m] to Sout[1] are activated. However, during operation, the mapping between input word DAC input word DACIN[n:1] to control signals Sout[m] to Sout[1] can be modified from conversion to conversion. For example, during a first digital to analog conversion, a first set of 256 control signals is asserted by dynamic element matching controller 510, and during a second digital to analog conversion, a second set of 256 control signals is asserted by dynamic element matching controller 510, where the second set of 256 control signals is different from the first set of 256 control signals. This change in mapping may be random, pseudo random, or deterministic.

When applied to embodiment successive approximation ADCs, the mapping between DAC input word DACIN[n:1] to control signals Sout[m] to Sout[1] may be modified on a conversion to conversion basis (e.g., the same mapping is used for each successive approximation cycle for a single analog-to-digital conversion and then changed for the next conversion), or may be modified after each successive approximation cycle. In some embodiments, dynamic element matching controller may independently modify the switching individually on every single unit capacitor Cunit within capacitor array 512. Alternatively, dynamic element matching controller and capacitor array 512 may be arranged in a segmented manner in which groups of unit capacitors are controlled using a single control signal, but are reassigned in a random, pseudo random, or deterministic basis. In even further embodiments, dynamic element matching controller may dynamically modify the mapping of only a subset of control signals Sout[m] to Sout[1], without modify the mapping of the remaining control signals.

FIG. 5B illustrates one possible way of implementing dynamic element matching controller 510. As shown, dynamic element matching controller 510 includes thermometer decoder 502 and scrambler 504. During operation, thermometer decoder 502 converts n-bit DAC input word DACIN[n:1] to an m-bit thermometer code DACT[n:1]. Scrambler 504, in turn routes each bit of DACT[m:1] to a respective bit of control signal Sout[m:1], such that the mapping changes at each clock cycle of clock signal Clk. Scrambler 504 may be implemented, for example, using dynamic element matching circuit scrambler circuits known in the art. For example, scrambler 504 may be implemented using a plurality of multiplexer circuits that is controlled by a linear feedback shift register. Alternatively, other scrambler implementations may be used.

FIG. 5C illustrates a table illustrating the operation of dynamic element matching controller 510 for a 3-bit DAC input word DACIN[n:1] and an 8 bit control signal Sout[m:1]. As shown, during clock cycles 1 to 5, the DAC input word DACIN[3:1] is equal to 100, resulting in a thermometer coded word of DACT[8:1]=0000 1111, in which four bits are high. The output of each control word Sout[8:1] also contains 4 high bits, however the bit positions in the control word is modified at each clock cycle. During clock cycles 6 to 10, DAC input word DACIN[3:1] is equal to 010, resulting in a thermometer coded word of DACT[8:1]=0000 0011, in which two bits are high. The output of each control word Sout[8:1] also contains 2 high bits, the positions of which are modified at each clock cycle. It should be understood that the operation of dynamic element matching controller 510 shown in FIG. 5C is just one illustrative example of how an embodiment dynamic element matching controller might operate. In alternative embodiments, different bit widths and code mappings may be used.

Embodiment redundant successive approximation ADCs may be applied to a wide variety of different systems and applications. One example of such a system is a radio frequency receiver, such as radio frequency receiver 600 illustrated in FIG. 6A. As shown, radio frequency receiver 600 includes an RF signal path having antenna 602, low noise amplifier 604, mixer 606, programmable gain amplifier 608, filter 610, embodiment successive approximation ADC 612, and processor 614. During operation, a radio frequency signal received by antenna 602 is amplified by low noise amplifier 604. Mixer 606 performs a downconversion which translates the frequency of the received radio frequency signal to an intermediate frequency or to a baseband frequency. The output of mixer 606 is amplified by programmable gain amplifier 608, and the output of programmable gain amplifier 608 is filtered by filter 610. The filtering provided by filter 610 may be used to reject out of band frequency content and/or serve as an anti-aliasing filter for successive approximation ADC 612. Successive approximation ADC 612 may be implemented, for example, using embodiment redundant successive approximation ADC circuits and systems described herein. For example, the ADC shown in FIG. 1A or the ADC shown and described above with respect to FIG. 3A may be used to implement successive approximation ADC 612. Processor 614 may perform signal processing on the output of successive approximation ADC 612.

Figure 6A:
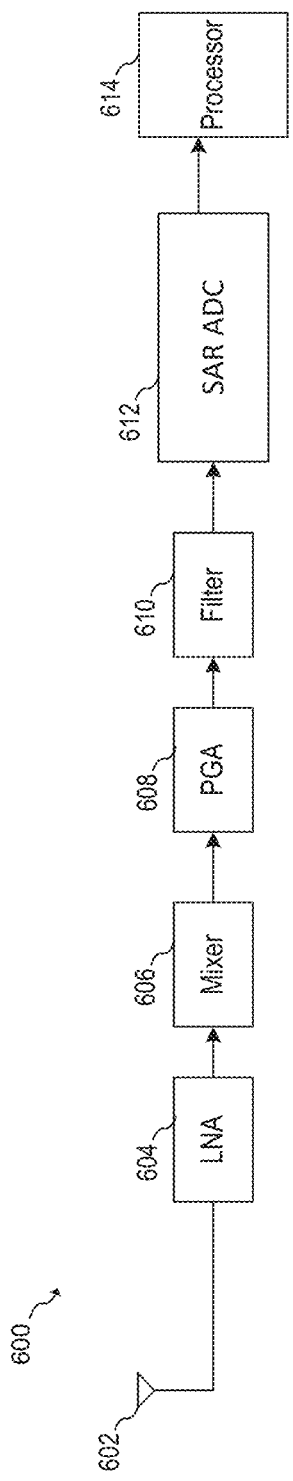
FIG. 6A illustrates an embodiment radio frequency receiver that utilizes an embodiment successive approximation ADC.

In various embodiments, radio frequency receiver 600 may be used in a wide variety of radio frequency-based systems. For example, radio frequency receiver 600 may be used as the receive signal path for a cellular telephone, or other wireless device. Radio frequency receiver 600, may also be used, for example, in a radar system, such as a millimeter-wave radar system. In the case of a radar system, the improvement in linearity afforded by the use of an embodiment successive approximation ADC 612 may result in improved SFDR in the received spectra as described above with respect to FIG. 1D. It should be understood, however, that the architecture of radio frequency receiver 600 illustrated in FIG. 6A is just one example of many possible radio frequency receiver implementations that may be implemented using embodiment successive approximation ADCs.

Figure 6B:
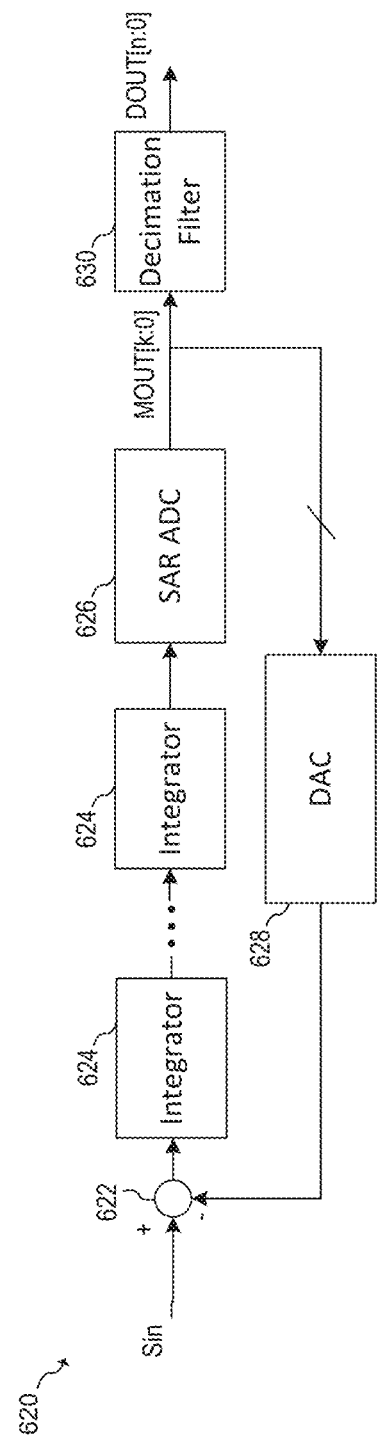
FIG. 6B illustrates an embodiment sigma delta ADC that utilizes an embodiment successive approximation ADC as a multi-level comparator.

Embodiment redundant successive approximation ADCs may also be used as a subcomponent in other data conversion systems. For example, an embodiment redundant successive approximation ADC could be used as a multilevel comparator in the implementation of a Sigma Delta ADC, such as is illustrated in FIG. 6B. Turning to FIG. 6B, an embodiment Sigma Delta ADC 620 is shown, which includes subtraction circuit 622, integrators 624, embodiment redundant successive approximation ADC 626, successive approximation ADC 612, and decimation filter 630.

In various embodiments, a multi-bit Sigma Delta modulator is formed using integrator 624, successive approximation ADC 626, DAC 628 and subtraction circuit 622. During operation, integrator 624 integrates the difference between inputs signal Sin and the output of DAC 628. This integrated difference is evaluated by successive approximation ADC, which functions as a multibit comparator. The output of successive approximation ADC 626 is input into digital at to analog converter 628. Operation of the modulator operates according to Sigma Delta modulator principles known in the art. While only two integrators 624 are shown for ease of illustration, more than two integrators 624 may be used in order to implement a higher order Sigma Delta modulator.

Integrator 624 may be implemented, for example, using switch capacitor integrator structures known in the art, or may be implemented using continuous time integrators. DAC 628 may be implemented using DAC circuits and systems known in the art.

Decimation filter 630 may be used to reduce the sample rate of the modulator output, as well as increasing the bit width of the output. Decimation filter 630 may be implemented, for example, using decimation filter architectures known in the art. For example, decimation filter 630 may include a comb filter implemented using a cascade of accumulators followed by a cascade of difference circuits. An IIR filter or an FIR filter may also be used to provide further filtering. Alternatively, other filter structures may be used. It should be understood that Sigma Delta ADC 620 illustrated in FIG. 6B is just one of many example Sigma Delta ADC structures that may be used in conjunction with embodiment redundant successive approximation ADC circuits and systems known in the art. Advantageously, Sigma Delta ADCs that utilize embodiment redundant successive approximation ADC circuits may achieve a higher overall resolution due to the improved linearity of the SAR ADC.

Figure 7:
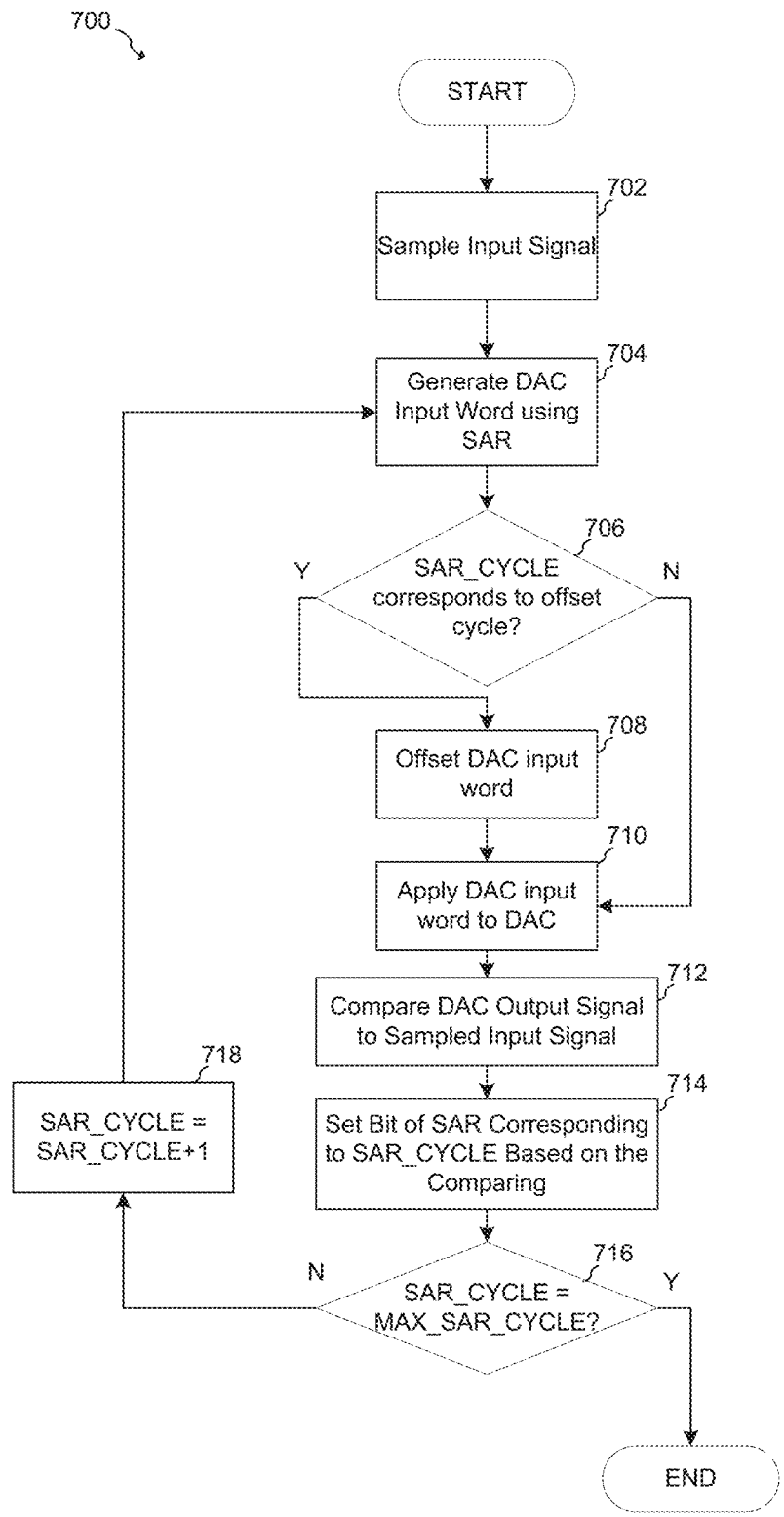
FIG. 7 illustrates a block diagram of an embodiment method of performing an analog-to-digital conversion that includes the application of DAC word offsets on selected decisions.

FIG. 7 illustrates a block diagram of an embodiment method 700 performing an analog-to-digital conversion. This method may be applied to embodiment successive approximation ADCs described herein that are implemented with a DAC comprising DAC reference elements having at least one sub-binary weighted DAC reference element.

These DAC reference elements may be implemented, for example, using capacitors in the case of a charge redistribution ADC, or current sources in the case of a current DAC. In step 702, an input signal is sampled. In some embodiments, the input signal may be sampled using a sample and hold circuit, such as sample and hold circuit 102 shown in FIG. 1A or sample and hold circuit 420 shown in FIG. 4B. In other embodiments, the input signal may be sampled by applying the input signal to the bottom plates of a charge redistribution DAC, such as DACs 308 and 310 shown in FIG. 3A.

In step 704, a DAC input word is generated using a successive approximation register (SAR), such as successive approximation logic 108 shown and described above. In step 706, a determination is made as to whether the current successive approximation cycle SAR_CYCLE corresponds to a predetermined successive approximation cycle in which offset is to be applied. In some embodiments, this predetermined successive approximation cycle may be a successive approximation cycle which corresponds to at least one sub-binary weighted reference element in the DAC that has a corresponding redundancy window. If the current successive approximation cycle SAR_CYCLE corresponds to a predetermined successive approximation cycle in which offset is to be applied, an offset is applied to the DAC input word in step 708. In various embodiments, this offset may be applied, for example, using offset logic 110 as described above. If the current successive approximation cycle SAR_CYCLE does not correspond to the predetermined successive approximation cycle in which offset is to be applied, no offset is applied.

In step 710, the DAC input word is applied to the input of the DAC, and in step 712, the DAC output signal is compared to the sampled input signal. In various embodiments, this comparison may be performed, for example, using comparator 106 shown in FIG. 1A or comparator 306 shown in FIG. 3A as described above. In step 714, the bit of the SAR corresponding to the current successive approximation cycle SAR_CYCLE is set based on the result of the comparison in step 712. In step 716 a determination is made as to whether the current successive approximation cycle SAR_CYCLE is the last successive approximation cycle SAR_CYCLE_MAX. If current successive approximation cycle SAR_CYCLE is the last successive approximation cycle SAR_CYCLE_MAX, then the conversion is complete. If the current successive approximation cycle SAR_CYCLE is not the last successive approximation cycle SAR_CYCLE_MAX, then the current successive approximation cycle SAR_CYCLE is incremented in step 718, and another current successive approximation cycle is performed starting again at step 704.

Embodiments of the present invention are summarized here. Other embodiments can also be understood from the entirety of the specification and the claims filed herein.

Example 1

A method of operating a redundant successive approximation analog-to-digital converter (ADC) includes: sampling an input signal; and successively approximating the sampled input signal using a digital-to-analog converter (DAC) including DAC reference elements having at least one sub-binary weighted DAC reference element, successively approximating the sampled input signal including performing a plurality of successive approximation cycles, each successive approximation cycle of the plurality of successive approximation cycles including: generating a DAC input word using a successive approximation register (SAR), offsetting the DAC input word to form an offset DAC input word when the successive approximation cycle corresponds to the at least one sub-binary weighted reference element, applying the offset DAC input word to an input of the DAC to produce a first DAC output signal, comparing the first DAC output signal with the sampled input signal using a comparator, and setting a bit of the SAR based on the comparing.

Example 2

The method of example 1, where offsetting the DAC input word includes modifying a state of at least one undecided bit of the DAC input word having a lower weight than a bit of the DAC input word associated with a present successive approximation cycle.

Example 3

The method of one of examples 1 or 2, where offsetting the DAC input word includes summing an offset value with the DAC input word.

Example 4

The method of one of examples 1 to 3, where offsetting the DAC input word modifies a successive approximation trajectory for input signals within a DAC code redundancy region associated with the at least one sub-binary weighted element.

Example 5

The method of example 4, where modifying the successive approximation trajectory reduces a number of bit transitions between at least two adjacent output codes of the SAR.

Example 6

The method of one of examples 1 to 5, further including mapping a value of the SAR to a binary weighed output after successively approximating the sampled input signal, mapping including multiplying bits of the SAR with corresponding weights of the DAC reference elements.

Example 7

An analog-to-digital converter (ADC) including: a digital-to-analog converter (DAC) including redundant codes; a comparator coupled to an output of the DAC; a successive approximation register (SAR) coupled to an output of the comparator; and a code adjustment circuit coupled between the SAR and an input of the DAC, the code adjustment circuit configured to offset an input code to the DAC during at least one successive approximation cycle.

Example 8

The ADC of example 7, where the DAC includes a plurality of DAC reference elements, where at least one of the plurality of DAC reference elements is sub-binary weighted DAC reference element.

Example 9

The ADC of example 8, where the DAC includes a charge redistribution DAC, and the plurality of DAC reference elements include capacitors.

Example 10

The ADC of example 9, where the code adjustment circuit is configured to offset the input code during a charge redistribution phase.

Example 11

The ADC of example 9 or 10, where the DAC is further configured to sample an input signal.

Example 12

The ADC of one of examples 8 to 11, where the DAC includes a current DAC, and the plurality of DAC reference elements include current sources.

Example 13

The ADC of one of examples 8 to 12, where the at least one successive approximation cycle is associated with the sub-binary weighted DAC reference element.

Example 14

The ADC of one of examples 7 to 13, where the code adjustment circuit is configured to offset the input code to the DAC by modifying a state of at least one undecided bit of the input code to the DAC having a lower weight than a bit of the input code associated with the at least one successive approximation cycle.

Example 15

The ADC of example 14, where the code adjustment circuit includes at least one multiplexer configured to change the state of the bit of the input code to the DAC having the lower weight.

Example 16

The ADC of one of examples 7 to 15, further including a sample and hold circuit having an output coupled to the comparator.

Example 17

An analog-to-digital converter (ADC) includes: a charge redistribution digital-to-analog converter (DAC) including a plurality of capacitors having a common node, where at least one of the plurality of capacitors includes a sub-binary weight, and a plurality of DAC input codes map to a same output space within a redundancy region associated with the at least one of the plurality of capacitors including the sub-binary weight; a comparator coupled to the common node of the charge redistribution DAC; a successive approximation register (SAR) coupled to an output of the comparator; an offset circuit coupled between an output of the SAR and an input of the DAC, the offset circuit configured to offset an input code to the DAC during at least one successive approximation cycle associated with the at least one of the plurality of capacitors including the sub-binary weight; and an output code mapping circuit coupled between the output of the SAR and an output of the ADC, the output code mapping circuit configured to convert an output of the SAR to a binary weighted output value.

Example 18

The ADC of example 17, where the offset circuit includes at least one multiplexer configured to modify at least one first bit output by the SAR during a charge redistribution phase of the at least one successive approximation cycle associated with the at least one of the plurality of capacitors including the sub-binary weight.

Example 19

The ADC of one of examples 17 or 18, where: the plurality of capacitors include sub-capacitors; and the DAC further includes a plurality of switches selectively coupled to the sub-capacitors, and a dynamic element matching controller coupled to the plurality of switches and the input of the DAC, the dynamic element matching controller configured to dynamically reassign the sub-capacitors to capacitors of the plurality of capacitors.

Example 20

The ADC of one of examples 17 to 19, where: offsetting the input code to the DAC modifies a successive approximation trajectory for input signals within the redundancy region; and modifying the successive approximation trajectory reduces a number of bit transitions between at least two adjacent output codes of the SAR.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a redundant successive approximation analog-to-digital converter (ADC), the method comprising:
    sampling an input signal; and
    successively approximating the sampled input signal using a digital-to-analog converter (DAC) comprising DAC reference elements having at least one sub-binary weighted DAC reference element, successively approximating the sampled input signal comprising performing a plurality of successive approximation cycles, each successive approximation cycle of the plurality of successive approximation cycles comprising:
        generating a DAC input word using a successive approximation register (SAR),
        offsetting the DAC input word to form an offset DAC input word when the successive approximation cycle corresponds to the at least one sub-binary weighted reference element,
        applying the offset DAC input word to an input of the DAC to produce a first DAC output signal,
        comparing the first DAC output signal with the sampled input signal using a comparator, and
        setting a bit of the SAR based on the comparison.

2. The method of claim 1, wherein offsetting the DAC input word comprises modifying a state of at least one undecided bit of the DAC input word having a lower weight than a bit of the DAC input word associated with a present successive approximation cycle.

3. The method of claim 1, wherein offsetting the DAC input word comprises summing an offset value with the DAC input word.

4. The method of claim 1, wherein offsetting the DAC input word modifies a successive approximation trajectory for input signals within a DAC code redundancy region associated with the at least one sub-binary weighted element.

5. The method of claim 4, wherein modifying the successive approximation trajectory reduces a number of bit transitions between at least two adjacent output codes of the SAR.

6. The method of claim 1, further comprising mapping a value of the SAR to a binary weighed output after successively approximating the sampled input signal, mapping comprising multiplying bits of the SAR with corresponding weights of the DAC reference elements.

7. An analog-to-digital converter (ADC) comprising:
    a digital-to-analog converter (DAC) comprising redundant codes;
    a comparator coupled to an output of the DAC;
    a successive approximation register (SAR) coupled to an output of the comparator; and
    a code adjustment circuit coupled between the SAR and an input of the DAC, the code adjustment circuit configured to offset an input code to the DAC during at least one successive approximation cycle.

8. The ADC of claim 7, wherein the DAC comprises a plurality of DAC reference elements, wherein at least one of the plurality of DAC reference elements is sub-binary weighted DAC reference element.

9. The ADC of claim 8, wherein the DAC comprises a charge redistribution DAC, and the plurality of DAC reference elements comprise capacitors.

10. The ADC of claim 9, wherein the code adjustment circuit is configured to offset the input code during a charge redistribution phase.

11. The ADC of claim 9, wherein the DAC is further configured to sample an input signal.

12. The ADC of claim 8, wherein the DAC comprises a current DAC, and the plurality of DAC reference elements comprise current sources.

13. The ADC of claim 8, wherein the at least one successive approximation cycle is associated with the sub-binary weighted DAC reference element.

14. The ADC of claim 7, wherein the code adjustment circuit is configured to offset the input code to the DAC by modifying a state of at least one undecided bit of the input code to the DAC having a lower weight than a bit of the input code associated with the at least one successive approximation cycle.

15. The ADC of claim 14, wherein the code adjustment circuit comprises at least one multiplexer configured to change the state of the bit of the input code to the DAC having the lower weight.

16. The ADC of claim 7, further comprising a sample and hold circuit having an output coupled to the comparator.

17. An analog-to-digital converter (ADC) comprising:
a charge redistribution digital-to-analog converter (DAC) comprising a plurality of capacitors having a common node, wherein at least one of the plurality of capacitors comprises a sub-binary weight, and a plurality of DAC input codes map to a same output space within a redundancy region associated with the at least one of the plurality of capacitors comprising the sub-binary weight;
a comparator coupled to the common node of the charge redistribution DAC;
a successive approximation register (SAR) coupled to an output of the comparator;
an offset circuit coupled between an output of the SAR and an input of the DAC, the offset circuit configured to offset an input code to the DAC during at least one successive approximation cycle associated with the at least one of the plurality of capacitors comprising the sub-binary weight; and
an output code mapping circuit coupled between the output of the SAR and an output of the ADC, the output code mapping circuit configured to convert an output of the SAR to a binary weighted output value.

18. The ADC of claim 17, wherein the offset circuit comprises at least one multiplexer configured to modify at least one first bit output by the SAR during a charge redistribution phase of the at least one successive approximation cycle associated with the at least one of the plurality of capacitors comprising the sub-binary weight.

19. The ADC of claim 17, wherein:
the plurality of capacitors comprise sub-capacitors; and
the DAC further comprises
　a plurality of switches selectively coupled to the sub-capacitors, and
　a dynamic element matching controller coupled to the plurality of switches and the input of the DAC, the dynamic element matching controller configured to dynamically reassign the sub-capacitors to capacitors of the plurality of capacitors.

20. The ADC of claim 17, wherein:
offsetting the input code to the DAC modifies a successive approximation trajectory for input signals within the redundancy region; and
modifying the successive approximation trajectory reduces a number of bit transitions between at least two adjacent output codes of the SAR.

* * * * *